(12) United States Patent
Kori et al.

(10) Patent No.: US 11,680,133 B2
(45) Date of Patent: Jun. 20, 2023

(54) MATERIAL FOR FORMING ORGANIC FILM, PATTERNING PROCESS, AND POLYMER

(71) Applicant: SHIN-ETSU CHEMICAL CO., LTD., Tokyo (JP)

(72) Inventors: Daisuke Kori, Joetsu (JP); Takayoshi Nakahara, Joetsu (JP); Kenta Ishiwata, Joetsu (JP); Yasuyuki Yamamoto, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 308 days.

(21) Appl. No.: 17/085,734

(22) Filed: Oct. 30, 2020

(65) Prior Publication Data

US 2021/0163675 A1    Jun. 3, 2021

(30) Foreign Application Priority Data

Nov. 28, 2019    (JP) .............................. JP2019-215420

(51) Int. Cl.
| | | |
|---|---|---|
| *G03F 7/075* | (2006.01) | |
| *G03F 7/09* | (2006.01) | |
| *G03F 7/11* | (2006.01) | |
| *C08G 61/02* | (2006.01) | |
| *G03F 1/50* | (2012.01) | |
| *G03F 7/004* | (2006.01) | |
| *G03F 7/32* | (2006.01) | |

(52) U.S. Cl.
CPC .............. *C08G 61/02* (2013.01); *G03F 1/50* (2013.01); *G03F 7/0045* (2013.01); *G03F 7/0047* (2013.01); *G03F 7/0752* (2013.01); *G03F 7/094* (2013.01); *G03F 7/11* (2013.01); *G03F 7/325* (2013.01); *C08G 2261/314* (2013.01); *C08G 2261/334* (2013.01)

(58) Field of Classification Search
CPC ......... C08G 61/02; G03F 1/50; G03F 7/0045; G03F 7/11
See application file for complete search history.

(56) References Cited

U.S. PATENT DOCUMENTS

| | | |
|---|---|---|
| 2002/0106909 A1 | 8/2002 | Kato et al. |
| 2005/0255712 A1 | 11/2005 | Kato et al. |
| 2006/0019195 A1 | 1/2006 | Hatakeyama et al. |
| 2006/0204891 A1 | 9/2006 | Hatakeyama |
| 2009/0274978 A1 | 11/2009 | Ohashi et al. |
| 2010/0099044 A1 | 4/2010 | Hatakeyama et al. |
| 2013/0302990 A1 | 11/2013 | Watanabe et al. |
| 2013/0337649 A1* | 12/2013 | Tachibana ............... G03F 7/094 528/212 |
| 2014/0246400 A1 | 9/2014 | Higashihara et al. |
| 2014/0284850 A1* | 9/2014 | Drake ..................... C08G 65/48 524/508 |
| 2014/0323668 A1 | 10/2014 | Burgoyne, Jr. et al. |
| 2017/0184968 A1* | 6/2017 | Kori ....................... C09D 5/008 |
| 2019/0300498 A1 | 10/2019 | Tachibana et al. |

FOREIGN PATENT DOCUMENTS

| | | |
|---|---|---|
| EP | 3550362 A1 | 10/2019 |
| JP | H06-118651 A | 4/1994 |
| JP | 2002-334869 A | 11/2002 |
| JP | 2005-128509 A | 5/2005 |
| JP | 2006-285095 A | 10/2006 |

(Continued)

OTHER PUBLICATIONS

Jul. 8, 2021 Office Action issued in Taiwanese Patent Application No. 109141225.

(Continued)

*Primary Examiner* — Duane Smith
*Assistant Examiner* — Nicholas E Brown
(74) *Attorney, Agent, or Firm* — Oliff PLC

(57) ABSTRACT

A material for forming an organic film contains a polymer having a repeating unit shown by the following general formula (1), and an organic solvent, where AR1 and AR2 each represent a benzene ring or a naphthalene ring which optionally have a substituent; $W_1$ represents a divalent organic group having 2 to 20 carbon atoms and no aromatic ring, and a methylene group constituting the organic group is optionally substituted with an oxygen atom or a carbonyl group; and $W_2$ represents a divalent organic group having 6 to 80 carbon atoms and at least one or more aromatic rings. This invention provides: an organic film material being excellent in film formability and enabling high etching resistance and excellent twisting resistance and filling property; a patterning process using this material; and a polymer suitable for such an organic film material.

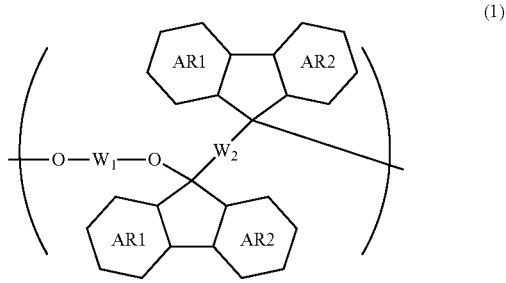

(1)

20 Claims, 2 Drawing Sheets

(56) References Cited

FOREIGN PATENT DOCUMENTS

| JP | 2006-293298 A | 10/2006 |
|---|---|---|
| JP | 2007-199653 A | 8/2007 |
| JP | 2009-269953 A | 11/2009 |
| JP | 4355943 B2 | 11/2009 |
| JP | 2010-122656 A | 6/2010 |
| JP | 2013-253227 A | 12/2013 |
| TW | 201732438 A | 9/2017 |
| WO | 2004/066377 A1 | 8/2004 |
| WO | 2013/047106 A1 | 4/2013 |
| WO | 2013/074120 A1 | 5/2013 |

OTHER PUBLICATIONS

May 3, 2021 Search Report issued in European Patent Application No. 20205565.3.
Shoji; "The Syntheses of 9-Aryl-9, 9'-bifluorenyls and 9-Aryl-9-alkoxyfluorenes"; Nippon Kagaku Zasshi—Journal of the Chemical Society of Japan, Pure Chemistry Section; 1963; vol. 84; No. 2; pp. 185-188.

\* cited by examiner

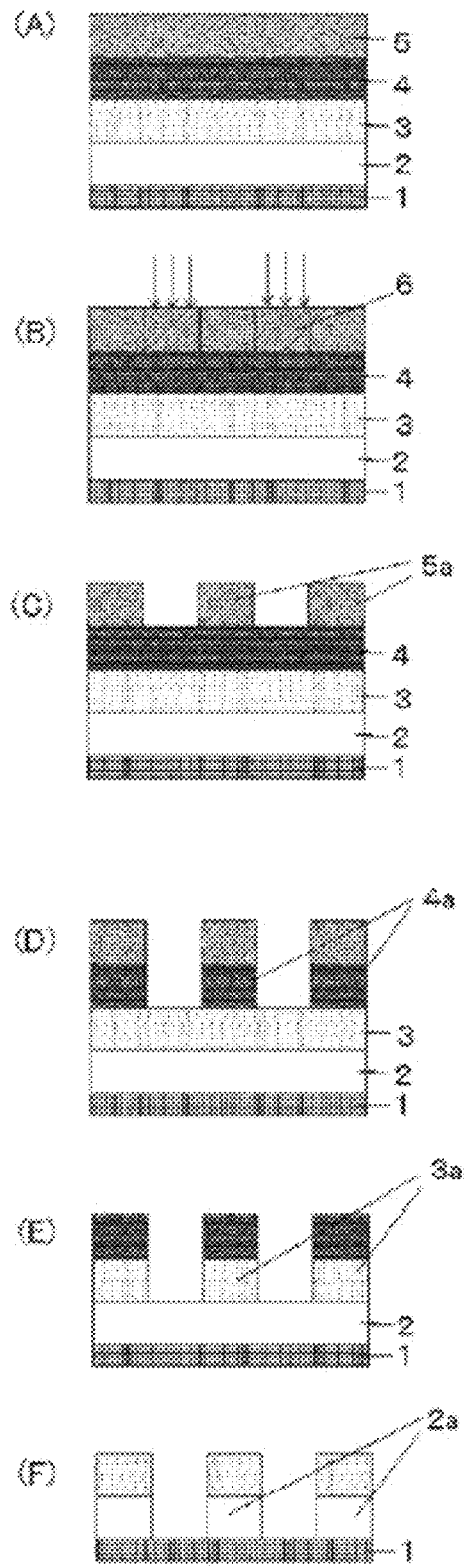
[FIG. 1]

[FIG. 2]
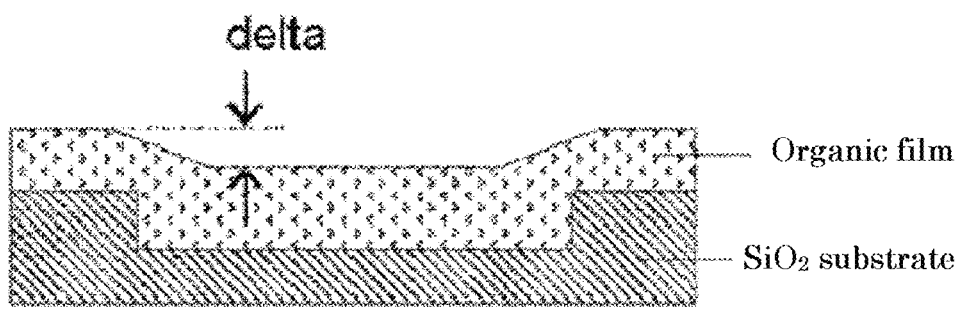

MATERIAL FOR FORMING ORGANIC FILM, PATTERNING PROCESS, AND POLYMER

TECHNICAL FIELD

The present invention relates to: a coating-type organic film employed in fine patterning in processes of manufacturing semiconductor devices and the like; and a patterning process which uses the organic film and is suitable for exposure with deep ultraviolet ray, KrF excimer laser beam (248 nm), ArF excimer laser beam (193 nm), $F_2$ laser beam (157 nm), $Kr_2$ laser beam (146 nm), $Ar_e$ laser beam (126 nm), extreme ultraviolet ray (EUV, 13.5 nm), electron beam (EB), and X-ray, and so forth.

BACKGROUND ART

Recently, along with advancements toward higher integration and higher processing speed of semiconductor devices, a finer pattern rule has been required. In this situation, various techniques have been developed in regard to how patterning process can be performed more finely and precisely depending on light sources used in lithography with light exposure, which is a commonly-employed technique at present.

As the light source for lithography employed in resist pattern formation, light exposure using a g-line (436 nm) or an i-line (365 nm) of a mercury lamp is widely adopted for portions where the degree of integration is low. Meanwhile, for portions where the degree of integration is high and finer patterning is required, lithography using a KrF excimer laser (248 nm) or an ArF excimer laser (193 nm) with shorter wavelengths has also been practically used. Moreover, for the most-advanced generation requiring further finer patterning, lithography with extreme ultraviolet ray (EUV, 13.5 nm) is about to be put into practical use.

It is well known that in a monolayer resist method, which is typically employed as a resist patterning process, as the thinning of resist patterns progresses as described above, the ratio of a pattern height to a pattern line width (aspect ratio) is increased, and pattern collapse occurs due to the surface tension of a developer during development. In this situation, it is known that a multilayer resist method, in which a pattern is formed by laminating films having different dry etching properties, is excellent in forming a pattern with a high aspect ratio on an uneven substrate. There have been developed: a two-layer resist method in which a photoresist layer made of a silicon-containing photosensitive polymer is combined with an underlayer made of an organic polymer containing carbon, hydrogen, and oxygen as main constituent elements, for example, a novolak polymer (Patent Documents 1); and a three-layer resist method in which a photoresist layer made of an organic photosensitive polymer used in a monolayer resist method is combined with a middle layer made of a silicon-based polymer or a silicon-based CVD film, and an underlayer made of an organic polymer (Patent Documents 2).

In this three-layer resist method, first, a fluorocarbon-based dry etching gas is used to transfer the pattern of the photoresist layer to the silicon-containing middle layer. Then, using the pattern as a mask, dry etching with an oxygen-containing gas is performed to transfer the pattern to the organic underlayer film containing carbon and hydrogen as main constituent elements. By dry etching using the resultant as a mask, the pattern is formed on a substrate to be processed. However, in semiconductor device manufacturing processes after the 20-nm generation, when the pattern is transferred to a substrate to be processed by dry etching using such an organic underlayer film pattern as a hard mask, phenomena are observed in which the underlayer film pattern is twisted and/or curved.

The carbon hard mask formed immediately above the substrate to be processed is generally an amorphous carbon (hereinafter CVD-C) film prepared by a CVD method using a methane gas, an ethane gas, an acetylene gas, or the like as raw materials. It is known that the amount of hydrogen atoms in the CVD-C film can be reduced quite small, and the CVD-C film is very effective against the twisting and curving of the pattern as described above. Nevertheless, it is also known that when the substrate to be processed used as a base has a step, it is difficult to fill such a step into a flat state due to the characteristics of the CVD process. As a result, when a substrate to be processed having a step is coated with a CVD-C film and then patterned with a photoresist, the step of the substrate to be processed causes the applied surface of the photoresist to have a step. This makes the photoresist film thickness non-uniform, and consequently the focus margin and the pattern profile during lithography degraded.

On the other hand, it is known that when an underlayer film serving as the carbon hard mask formed immediately above the substrate to be processed is formed by a spin coating method, there is an advantage that a step(s) of the uneven substrate can be filled into a flat state. Planarizing the substrate by using the underlayer film material reduces fluctuations in film thicknesses of a silicon-containing middle layer and a photoresist coated on the underlayer film, can increase the focus margin in lithography, and can form a correct pattern.

Hence, there are demands for: an underlayer film material which allows formation of an organic underlayer film by a spin coating method, the organic underlayer film enabling formation of a film having high etching resistance in dry etching a substrate to be processed and high planarizing property on the substrate to be processed; and a method for forming such an underlayer film.

Conventionally, condensed resins using aromatic alcohols and carbonyl compounds such as ketones and aldehydes as condensing agents for a phenol compound or naphthol compound have been known as the material for forming an organic film such as an underlayer film material described above in multilayer resist methods. Examples of such condensed resins include a fluorene bisphenol novolak resin described in Patent Document 3, a bisphenol compound and a novolak resin thereof described in Patent Document 4, a novolak resin of an adamantane phenol compound described in Patent Document 5, a bisnaphthol compound and a novolak resin thereof described in Patent Document 6, etc. The main skeletons of the resins used in these materials are constituted of naphthalene, fluorene, adamantane, or the like, each of which has high carbon density. However, their etching resistance and twisting resistance are not sufficient, and further improvements in etching have been desired.

To prevent the etching resistance degradation, no heteroatom such as oxygen is incorporated into a resin for underlayer film material. As an example of such a resin, Patent Document 7 describes a resin having a fluorene structure. Nevertheless, to form a cured film, a methylol compound or the like is added as a crosslinking agent to a composition to be used. For this reason, even if the carbon content of the resin is increased, this increase is offset by the low carbon content of the crosslinking agent, resulting in the problem of etching resistance degradation.

Further, as a crosslinking agent with high carbon density, a compound having a fluorene structure described in Patent Document 8 is proposed. Nevertheless, the crosslinking agent is highly crystalline by itself and poorly soluble in an organic solvent, so that common organic solvents cannot be used. In addition, due to the rigid structure, it is difficult to satisfy the required performances such as film formability, filling and planarizing properties which are required for underlayer film material.

CITATION LIST

Patent Literature

Patent Document 1: JP H6-118651 A etc.
Patent Document 2: JP 4355943 B etc.
Patent Document 3: JP 2005-128509 A
Patent Document 4: JP 2006-293298 A
Patent Document 5: JP 2006-285095 A
Patent Document 6: JP 2010-122656 A
Patent Document 7: WO 2013/047106 A1
Patent Document 8: WO 2013/074120 A1

SUMMARY OF INVENTION

Technical Problem

The present invention has been made in view of the above-described circumstances. An object of the present invention is to provide a material for forming an organic film, the material being excellent in film formability and enabling high etching resistance and excellent twisting resistance and filling property; a patterning process using this material; and a polymer suitable for such a material for forming an organic film.

Solution to Problem

To achieve the object, the present invention provides a material for forming an organic film comprising:
a polymer having a repeating unit shown by the following general formula (1); and
an organic solvent,

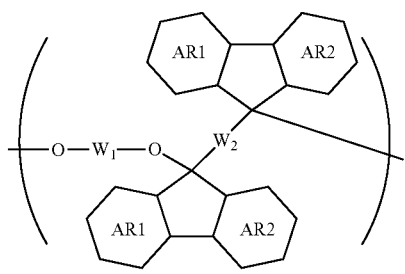

(1)

wherein AR1 and AR2 each represent a benzene ring or a naphthalene ring which optionally have a substituent; $W_1$ represents a divalent organic group having 2 to 20 carbon atoms and no aromatic ring, and a methylene group constituting the organic group is optionally substituted with an oxygen atom or a carbonyl group; and $W_2$ represents a divalent organic group having 6 to 80 carbon atoms and at least one or more aromatic rings.

Such a material for forming an organic film is excellent in film formability, and enables high etching resistance and excellent twisting resistance and filling property.

More preferably, the divalent organic group represented by $W_2$ in the general formula (1) is any of the following,

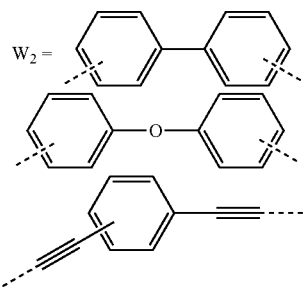

Introducing any of such partial structures at $W_2$ enhances the heat resistance and makes the polymer for forming an organic film excellent in etching resistance and twisting resistance.

Moreover, the polymer preferably has a weight-average molecular weight of 500 to 5000.

When the material for forming an organic film contains the polymer with this Mw range, the filling and planarizing properties are excellent without impairing the solubility into an organic solvent.

The inventive material for forming an organic film preferably further comprises an acid generator.

Such a material for forming an organic film generates an acid in a heating step after the application. The acid then promotes crosslinking. This makes it possible to more efficiently and reliably form an organic film having curving resistance and etching resistance.

More preferably, the inventive material for forming an organic film further comprises at least one of a surfactant, a plasticizer, and a compound having an aromatic ring as a partial structure other than the polymer.

The inventive material for forming an organic film may contain at least one of these components depending on the purpose thereof.

Moreover, the present invention provides a patterning process comprising:
forming an organic film by using the above-described material for forming an organic film on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching using the resist upper layer film having the formed pattern as a mask;
transferring the pattern to the organic film by etching using the silicon-containing resist underlayer film having the transferred pattern as a mask; and
further forming the pattern in the body to be processed by etching using the organic film having the transferred pattern as a mask.

Such a patterning process according to the three-layer resist process makes it possible to precisely form a fine pattern in a substrate to be processed.

Further, the present invention provides a patterning process comprising:
forming an organic film by using the above-described material for forming an organic film on a body to be processed;
forming a silicon-containing resist underlayer film by using a silicon-containing resist underlayer film material on the organic film;
forming an organic antireflective film on the silicon-containing resist underlayer film;
forming a resist upper layer film by using a photoresist composition on the organic antireflective film, so that a 4-layered film structure is constructed;
forming a circuit pattern in the resist upper layer film;
transferring the pattern to the organic antireflective film and the silicon-containing resist underlayer film by etching using the resist upper layer film having the formed pattern as a mask;
transferring the pattern to the organic film by etching using the silicon-containing resist underlayer film having the transferred pattern as a mask; and
further forming the pattern in the body to be processed by etching using the organic film having the transferred pattern as a mask.

Such a patterning process according to the four-layer resist process makes it possible to further precisely form a fine pattern in a substrate to be processed.

Furthermore, the present invention provides a patterning process comprising:
forming an organic film by using the above-described material for forming an organic film on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching using the resist upper layer film having the formed pattern as a mask;
transferring the pattern to the organic film by etching using the inorganic hard mask having the transferred pattern as a mask; and
further forming the pattern in the body to be processed by etching using the organic film having the transferred pattern as a mask.

Such a patterning process according to the three-layer resist process makes it possible to precisely form a fine pattern in a substrate to be processed.

Furthermore, the present invention provides a patterning process comprising:
forming an organic film by using the above-described material for forming an organic film on a body to be processed;
forming an inorganic hard mask selected from a silicon oxide film, a silicon nitride film, and a silicon oxynitride film on the organic film;
forming an organic antireflective film on the inorganic hard mask;
forming a resist upper layer film by using a photoresist composition on the organic antireflective film, so that a 4-layered film structure is constructed;
forming a circuit pattern in the resist upper layer film;
transferring the pattern to the organic antireflective film and the inorganic hard mask by etching using the resist upper layer film having the formed pattern as a mask;
transferring the pattern to the organic film by etching using the inorganic hard mask having the transferred pattern as a mask; and
further forming the pattern in the body to be processed by etching using the organic film having the transferred pattern as a mask.

Such a patterning process according to the four-layer resist process makes it possible to more precisely form a fine pattern in a substrate to be processed.

In these events, the inorganic hard mask is preferably formed by a CVD method or an ALD method.

In these ways, a fine pattern can be more precisely formed in a substrate to be processed.

Moreover, the pattern is preferably formed in the resist upper layer film by employing a method of a photolithography with a wavelength of 10 nm or more and 300 nm or less, direct drawing with electron beam, nanoimprinting, or a combination thereof.

By these methods, a fine pattern can be more precisely formed in a substrate to be processed.

Preferably, alkali development or organic solvent development is employed as a development method in the patterning process.

In these ways, a fine pattern can be more precisely formed in a substrate to be processed.

The body to be processed may be a semiconductor device substrate, a metal film, a metal carbide film, a metal oxide film, a metal nitride film, a metal oxycarbide film, or a metal oxynitride film.

In the present invention, for example, the aforementioned bodies to be processed are usable.

In these cases, the metal may be silicon, titanium, tungsten, hafnium, zirconium, chromium, germanium, cobalt, copper, silver, gold, aluminum, indium, gallium, arsenic, palladium, iron, tantalum, iridium, molybdenum, ruthenium, or an alloy thereof.

The present invention can employ these metals, for example.

Additionally, the present invention provides a polymer comprising a repeating unit shown by the following general formula (1),

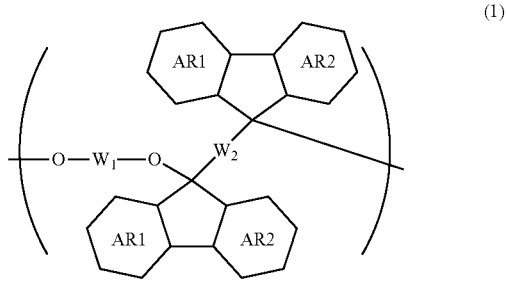

wherein AR1 and AR2 each represent a benzene ring or a naphthalene ring which optionally have a substituent; $W_1$ represents a divalent organic group having 2 to 20 carbon atoms and no aromatic ring, and a methylene group constituting the organic group is optionally substituted with an oxygen atom or a carbonyl group; and $W_2$ represents a divalent organic group having 6 to 80 carbon atoms and at least one or more aromatic rings.

Such a polymer is capable of forming a film having high carbon density, through the self-curing reaction or reaction with another resin by action of either or both of heat and acid. Hence, this polymer for forming an organic film enables formation of an organic film having both excellent twisting resistance and dry etching resistance. Further, the linking group $W_1$ bonded to flexible ether bonds in the repeating unit is appropriately selected in accordance with the required performances, so that the polymer for forming an organic film has enhanced thermal flowability and excellent filling and planarizing properties.

In this case, the divalent organic group represented by $W_2$ in the general formula (1) is preferably any of the following,

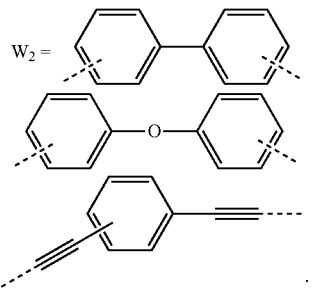

With any of such structures introduced, the polymer for forming an organic film achieves both etching resistance and twisting resistance. Further, since the heat resistance of the cured film can be enhanced, the film shrink during curing is suppressed, so that the polymer for organic film is excellent in filling and planarizing properties.

Advantageous Effects of Invention

As described above, the inventive polymer is a polymer having a tertiary ether in the repeating unit, and undergoes the curing reaction involving the elimination of the tertiary ether by action of either or both of heat and acid. Moreover, since the inventive polymer has the flexible ether structure and bulky fluorene structure in the repeating unit, the degree of crystallinity is lowered, so that the polymer for forming an organic film has high solubility into an organic solvent and excellent film formability and filling and planarizing properties. Further, a cured film is formed from the polymer by reaction of aromatic rings of its own or with another compound having an aromatic ring. This makes it possible to form a fine film with high carbon density. Accordingly, this polymer for forming an organic film is capable of forming an organic film excellent in etching resistance and twisting resistance. By incorporating this polymer, the material for forming an organic film is a useful material for forming an organic film having excellent etching resistance and twisting resistance as well as various properties such as heat resistance, and filling and planarizing properties. Thus, the inventive material for forming an organic film is quite useful as a resist underlayer film material in multilayer resist processes, for example, a two-layer resist process, a three-layer resist process using a silicon-containing resist underlayer film, or a four-layer resist process using a silicon-containing resist underlayer film and an organic antireflective film. Further, the inventive patterning processes make it possible to precisely form a fine pattern in a substrate to be processed in such multilayer resist processes.

BRIEF DESCRIPTION OF DRAWINGS

FIG. 1 is an exemplary process flow of the inventive patterning process.

FIG. 2 is a cross-sectional view for illustrating an exemplary organic film formed by applying the inventive material for forming an organic film on a $SiO_2$ wafer substrate having a trench pattern.

DESCRIPTION OF EMBODIMENTS

As described above, there have been demands for the development of a material for forming an organic film, the material being excellent in film formability and enabling high etching resistance and excellent twisting resistance and filling property; a patterning process using this material; and a polymer suitable for such a material for forming an organic film.

The compound having a fluorene structure described in Patent Document 8 is useful as a crosslinking agent with high carbon density, but has such high crystallinity that there is a problem of low solubility in an organic solvent.

The present inventors have earnestly studied the above-described object and consequently found that when a compound (monomer) having such a fluorene structure is used to form a polymer having a tertiary ether structure, the crystallinity can be relaxed. Further, the inventors have found that the resulting polymer is a crosslinkable polymer having excellent solubility into an organic solvent and high carbon content, and that when such a polymer is used in a material for forming an organic film, the material for forming an organic film is excellent in film formability and enables high etching resistance and excellent twisting resistance and filling property. These findings have led to the completion of the present invention.

Specifically, the present invention provides a material for forming an organic film, comprising:

a polymer having a repeating unit shown by the following general formula (1); and an organic solvent,

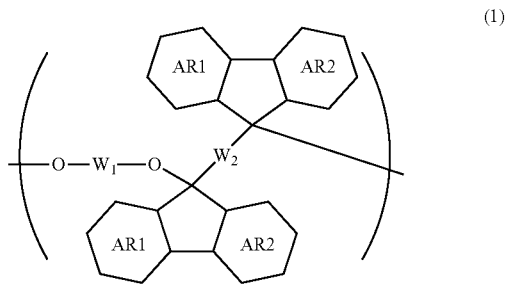

(1)

wherein AR1 and AR2 each represent a benzene ring or a naphthalene ring which optionally have a substituent; $W_1$ represents a divalent organic group having 2 to 20 carbon atoms and no aromatic ring, and a methylene group constituting the organic group is optionally substituted with an oxygen atom or a carbonyl group; and $W_2$ represents a divalent organic group having 6 to 80 carbon atoms and at least one or more aromatic rings.

Hereinafter, the present invention will be described in detail, but the present invention is not limited to the following.

<Polymer>

The present invention provides a polymer having a repeating unit shown by the following general formula (1).

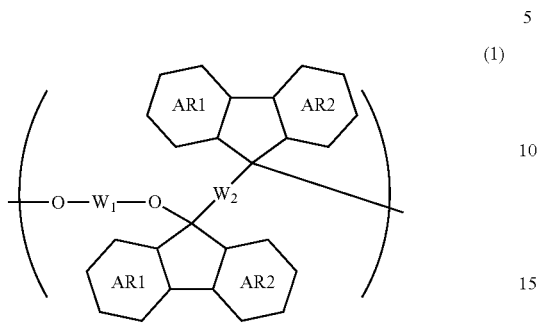
(1)

In the formula (1), AR1 and AR2 each represent a benzene ring or a naphthalene ring which optionally have a substituent. $W_1$ represents a divalent organic group having 2 to 20 carbon atoms and no aromatic ring, and a methylene group constituting the organic group is optionally substituted with an oxygen atom or a carbonyl group. $W_2$ represents a divalent organic group having 6 to 80 carbon atoms and at least one or more aromatic rings.

When an organic film formed from the composition containing the polymer shown by the general formula (1) is heated, curing takes place through reaction between an aromatic ring and a reactive cation on fluorene that is formed while a tertiary ether moiety including $W_1$ is eliminated by action of either or both of heat and acid. This mechanism enables formation of a cured film through self-curing of aromatic rings constituting the inventive polymer, or through reaction with a compound containing an aromatic ring that can react with another cation. The organic film obtained by such reactions have excellent etching resistance and twisting resistance because many condensed aromatic ring structures with high carbon density such as fluorene structures are introduced. Further, since the inventive polymer is not a monomer having a high degree of crystallinity but is a polymer having a molecular-weight distribution and multiple bulky fluorene structures in the molecule, the degree of crystallinity is reduced. Consequently, it is possible to form an organic film excellent in not only solubility into an organic solvent but also film formability, filling and planarizing properties on substrates that have complicated structures and are made of various materials.

Examples of a partial structure constituted of AR1, AR2, and $W_2$ in the general formula (1) include the following structural formulae, etc. These may have a substituent on aromatic rings thereof. Examples of the substituent include a hydroxyl group, a trifluoromethyl group, an alkyl group having 1 to 10 carbon atoms, an alkynyl group and alkenyl group having 3 to 10 carbon atoms, an alkyloxy group having 1 to 10 carbon atoms, an alkynyloxy group and alkenyloxy group having 3 to 10 carbon atoms, an aryl group having 6 to 10 carbon atoms, a thiol group, a nitro group, a halogen group, a nitrile group, a sulfonic acid group, an alkoxycarbonyl group having 1 to 10 carbon atoms, an alkanoyloxy group having 1 to 10 carbon atoms, etc. In the following formulae, a broken line represents a bonding site to the ether bond, and n1 represents an integer of 1 to 10.

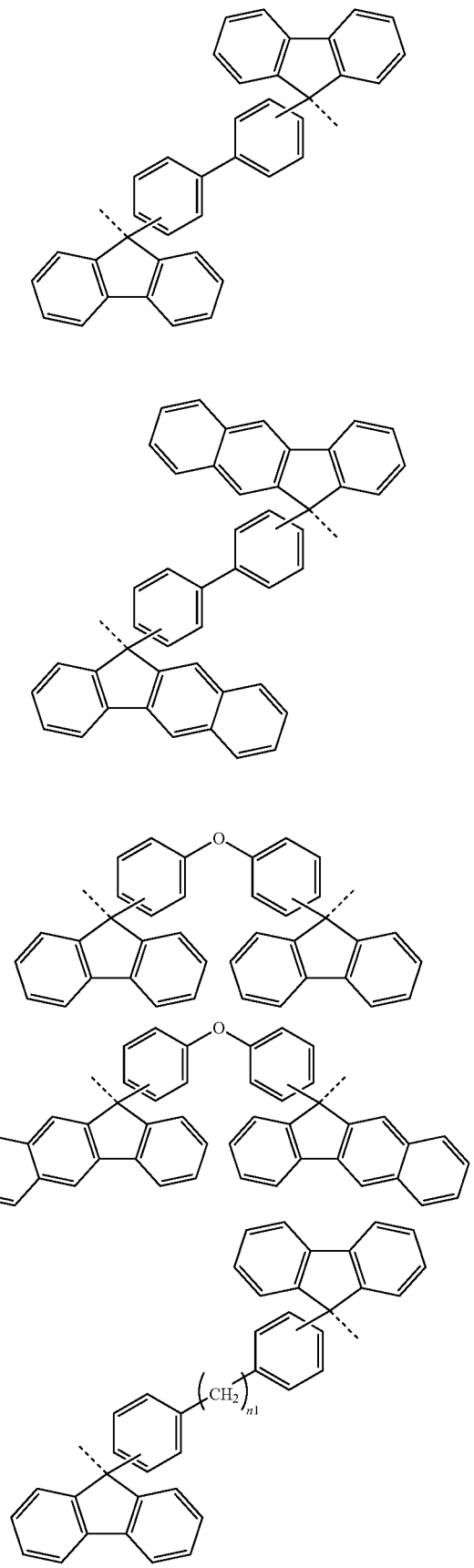

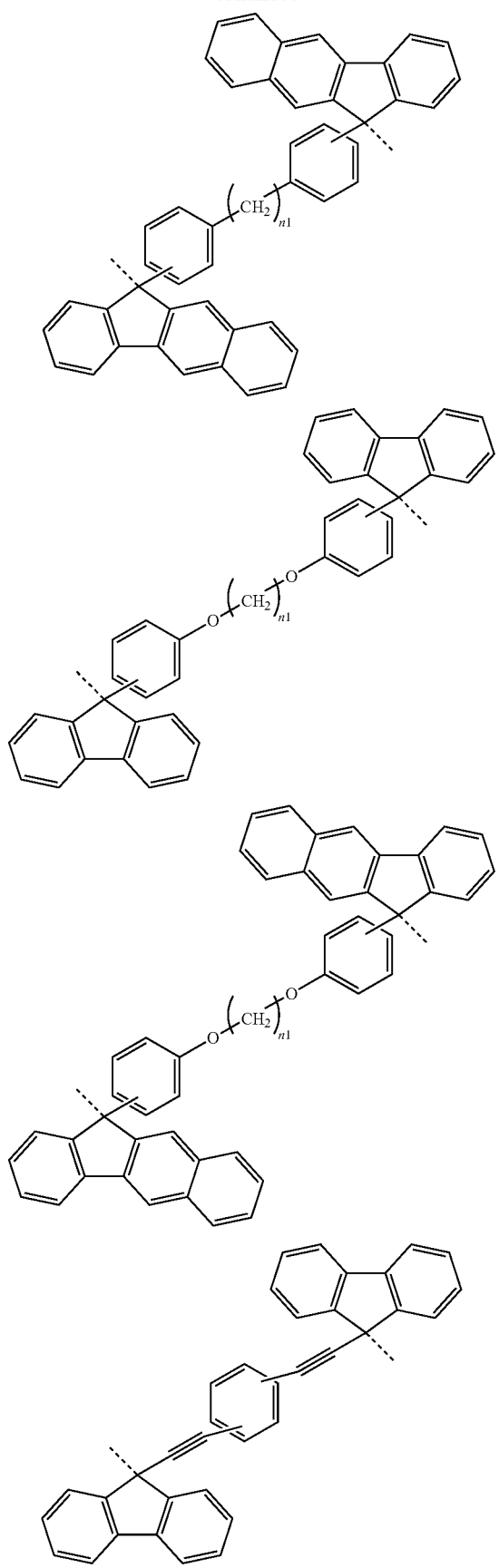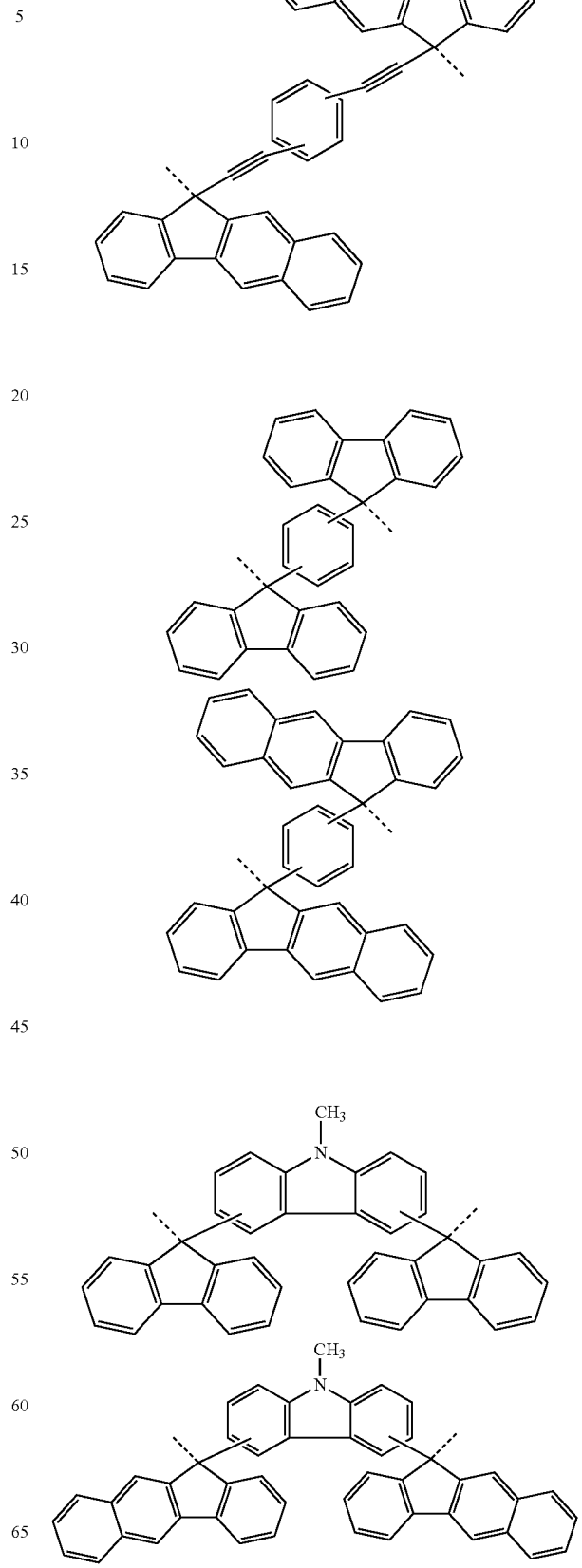

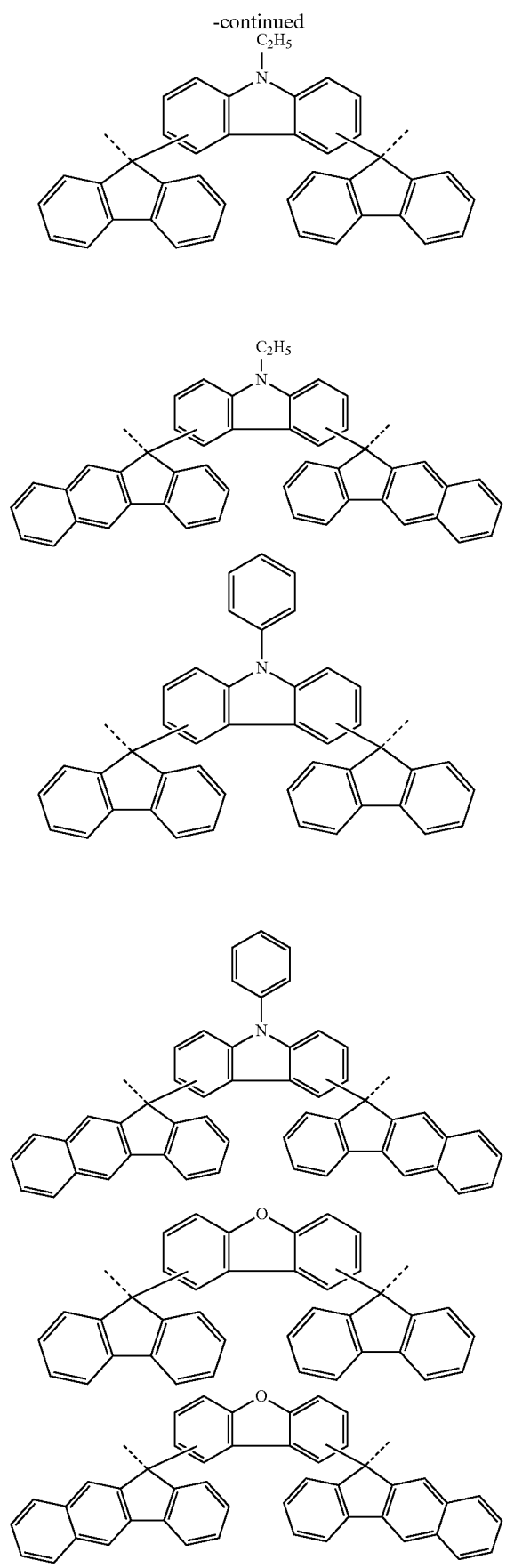
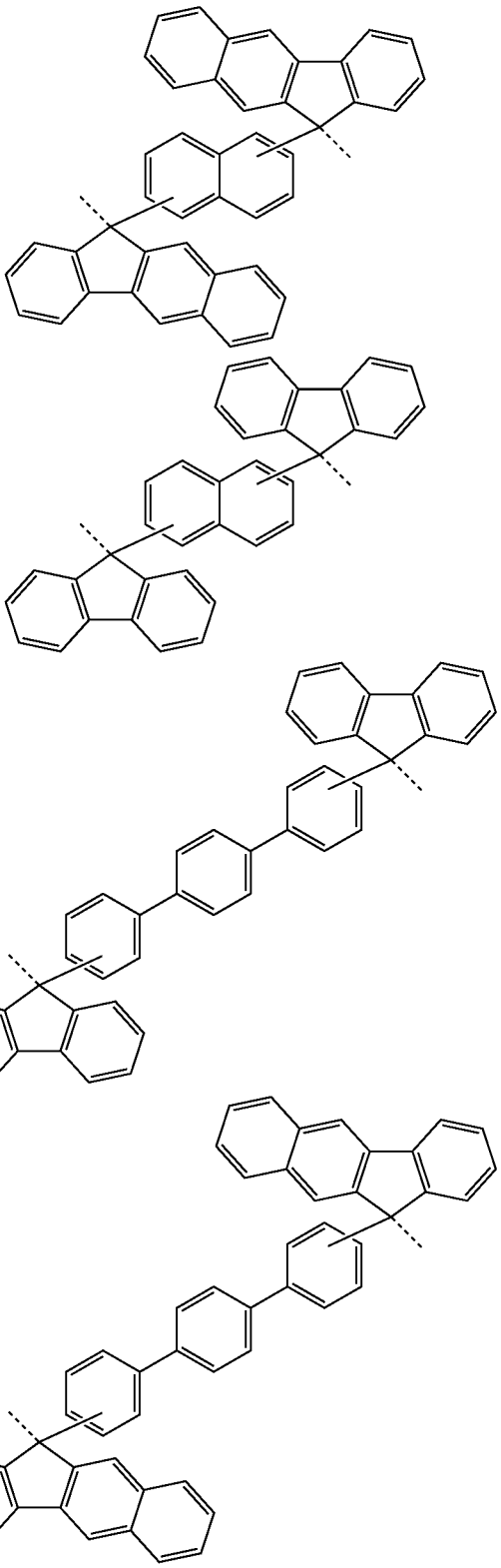
Among these formulae, from the viewpoints of availability of the raw material and heat resistance, AR1 and AR2 are more preferably each a benzene ring and thus constitute fluorene. Moreover, the divalent organic group represented by $W_2$ is preferably any of the following.

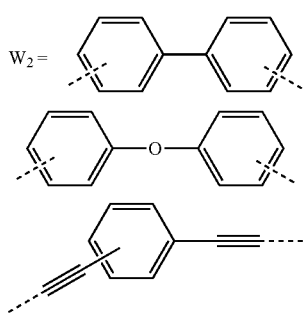

Examples of the divalent organic group shown by $W_1$ bonded to the ether bonds in the general formula (1) include the following structural formulae, etc. In the following formulae, each sign * represents a bonding site to the ether bond, n2 represents an integer of 1 to 20, n3 represents an integer of 1 to 17, n4 represents an integer of 1 to 18, and n5 represents an integer of 1 to 16.

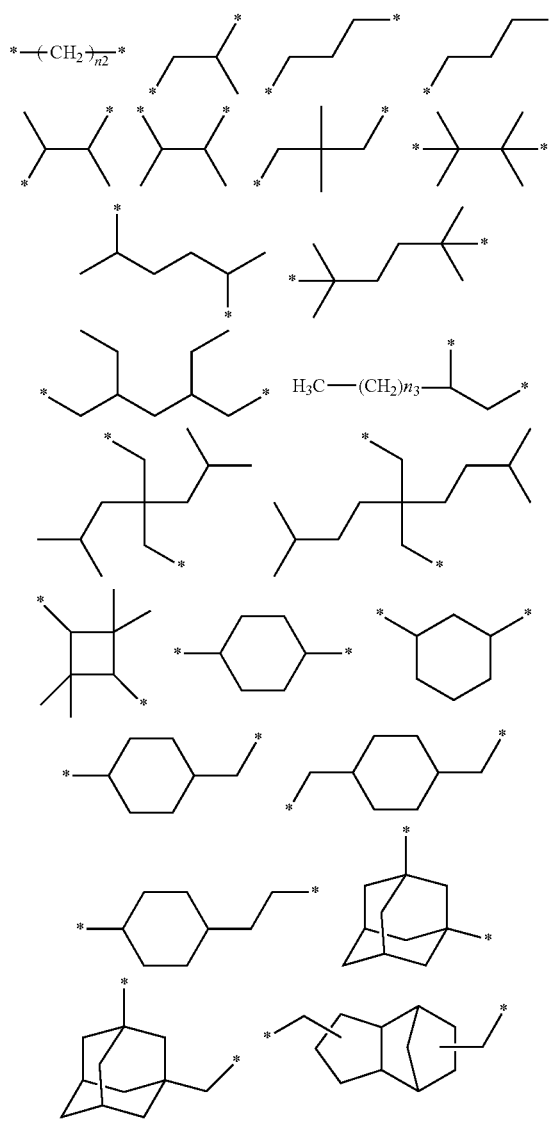

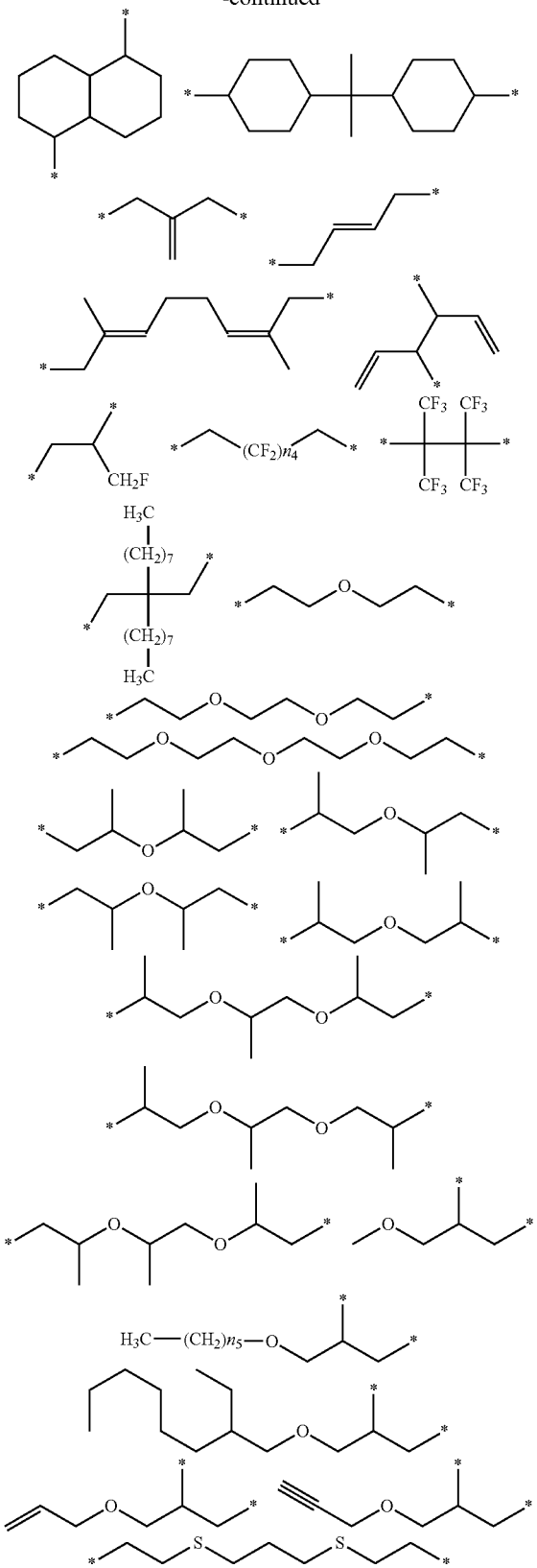

Among these formulae, $W_1$ preferably has 10 carbon atoms or less, and further preferably has two terminals each connected to the main chain via a primary ether bond. One having a glyme chain in an organic group thereof is furthermore preferable. $W_1$ acts as a leaving group when the self-curing reaction occurs by action of either or both of heat and acid. When the number of carbon atoms in $W_1$ is smaller, $W_1$ is less likely to remain in a film after baking, and the possibility of degrading the etching resistance is lower. Moreover, connecting to the main chain via a primary ether structure enhances the stability of the polymer against heat and acid, improves the storage stability, and makes the time longer before the elimination reaction occurs in the film formation. As a result, the thermal flow time can be increased, so that the filling and planarizing properties are enhanced. Furthermore, connecting to the main chain with a flexible glyme chain can impart thermal flowability and solvent solubility to the polymer.

Further, the polymer has a Mw (weight-average molecular weight) of preferably 500 to 5000, more preferably 1000 to 5000, further preferably 1000 to 3000, particularly preferably 1000 to 2500.

With such a molecular weight, the solubility into an organic solvent can be sufficiently guaranteed, and the film formability is further improved. The polymer for forming an organic film has favorable thermal flowability. Accordingly, when the polymer is blended into the inventive material for forming an organic film, it is possible to form an organic film that is capable of not only favorably filling a fine structure formed on a substrate but also planarizing the entire substrate.

[Polymer Production Method]

As an example of the method for producing the inventive polymer shown by the general formula (1), the inventive polymer can be synthesized by polycondensation using a diol having $W_1$ as a partial structure and a diol having $W_2$, AR1, and AR2 as a partial structure as shown below.

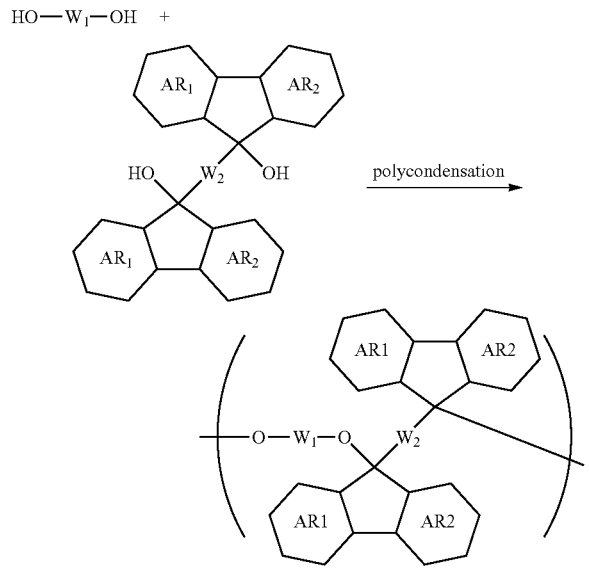

The polymer of the general formula (1) can be synthesized generally in an organic solvent in the presence of an acid catalyst at room temperature or under cooling or heating as necessary.

Examples of the acid catalyst that can be used include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

The solvent to be used is not particularly limited, as long as the solvent is inactive in the reaction. Examples of the solvent include ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; and non-protic polar solvents such as dimethylsulfoxide, N,N-dimethylformamide, and hexamethylphosphoric triamide. One of these or a mixture of two or more thereof can be used.

The reaction method includes a method in which the diol having $W_1$ as a partial structure and the diol having $W_2$, AR1, and AR2 as a partial structure are used as monomers, and the monomers and an acid catalyst as a catalyst are charged at once; a method in which the monomers are dispersed or dissolved, and then a catalyst is added at once or intermittently, or the catalyst is diluted with a solvent and added dropwise; and a method in which a catalyst is dispersed or dissolved, and then the monomers are added at once or intermittently, or the monomers are diluted with a solvent and added dropwise. In the reaction, one or multiple types of each of the diol having $W_1$ as a partial structure and the diol having $W_2$, AR1, and AR2 as a partial structure may be used. After completion of the reaction, the resultant may be diluted with an organic solvent and then subjected to liquid separation and washing to remove the catalyst having been used for the reaction and to collect the target product.

Further, during the reaction, a monovalent or a trivalent alcohol can also be used as a component for adjusting the molecular weight, in combination with the diol having $W_1$ as a partial structure. Examples of the monovalent alcohol include methanol, ethanol, 1-propanol, 2-propanol, isopropyl alcohol, 1-butanol, 2-butanol, 2-methyl-1-propanol, 2-methyl-2-propanol, 1-pentanol, 2-pentanol, 3-pentanol, neopentyl alcohol, 2-methyl-1-butanol, 3-methyl-1-butanol, 3-methyl-2-butanol, amyl alcohol, t-amyl alcohol, 1-hexyl alcohol, 2-hexanol, 3-hexanol, 2-ethyl-1-butanol, 3,3-dimethyl-1-butanol, 3, 3-dimethyl-2-butanol, 2-methyl-1-pentanol, 3-methyl-1-pentanol, 3-methyl-2-pentanol, 4-methyl-2-pentanol, 2-methyl-3-pentanol, 4-methyl-1-pentanol, 2,3-dimethyl-2-butanol, 2-methyl-2-pentanol, 3-methyl-3-pentanol, 1-heptanol, 2-heptanol, 3-heptanol, 2-methyl-2-hexanol, 3-ethyl-3-pentanol, 2,3-dimethyl-3-pentanol, 4,4-dimethyl-2-pentanol, 2,2-dimethyl-3-pentanol, 2,4-dimethyl-3-pentanol, 5-methyl-2-hexanol, 2-methyl-3-hexanol, 1-octanol, 2-octanol, 3-octanol, 2-propyl-1-pentanol, 6-methyl-2-heptanol, 4-methyl-3-heptanol, 2,2,4-trimethyl-1-pentanol, 2-ethyl hexanol, 1-nonanol, 2-nonanol, 2,6-dimethyl-4-heptanol, 3,7-dimethyl-3-octanol, 3,3,5-trimethyl-1-hexanol, 3-ethyl-2,2-dimethyl-3-pentanol, 1-decanol, 2-decanol, 3,7-dimethyl-1-octanol, cyclopropanemethanol, 1-methylcyclopropanemethanol, 2-methylcyclopropanemethanol, cyclobutanol, cyclobutanemethanol, cyclopentanol, cyclopentanemethanol, 3-cyclopentyl-1-propanol, 1-methylcyclopentanol, 2-methylcyclopentanol, 3-methylcyclopentanol, cyclohexylmethanol, dicyclohexylmethanol, trihexylmethanol, cyclohexanol, 2-cyclohexylethanol, 1-cyclohexylethanol, 3-cyclohexylpropanol, 4-cyclohexyl-1-butanol, 1-methylcyclohexanol, 2-methylcyclohexanol, 2-ethylcyclohexanol, 2-t-butylcyclohexanol, 3-methylcyclohexanol, 4-methylcyclohexanol, 4-ethylcyclohexanol, 4-t-butylcyclohexanol, 4-t-amylcyclohexanol, 2,3-dimethylcyclohexanol, decahydro-2-naphthol, 2-adamantanol, 1-adamantanemethanol, 1-adamantaneethanol, 2-methyl-2-adamantanol, 2-cyclohexen-1-ol, 3-cyclohexene-1-methanol, 3-methyl-2-cyclohexen-1-ol, 6-methyl-3-cyclohexene-1-methanol, menthol, 3,5-dimethylcyclohexanol, 3,3,5,5-tetramethylcyclohexanol, 2-methoxyethanol, 2-ethoxyethanol, 2-propoxyethanol, 2-isopropoxyethanol, 2-butoxyethanol, 2-cyclohexyloxyethanol, propylene glycol monomethyl ether, propylene glycol monoethyl ether, propylene glycol monopropyl ether, 3-methoxy-1-butanol, 3-methoxy-3-methyl-1-butanol, diethylene glycol monomethyl ether, triethylene glycol monoethyl ether, triethylene glycol monopropyl ether, triethylene glycol monomethyl ether, triethylene glycol monoethyl ether, triethylene glycol monopropyl ether, dipropylene glycol monomethyl ether, tripropylene glycol monoethyl ether, tripropylene glycol monopropyl ether, tripropylene glycol monomethyl ether, tripropylene glycol monomethyl ether, tripropylene glycol monopropyl ether, etc. Examples of the trivalent alcohol include glycerol, 2-(hydroxymethyl)-1,3-propanediol, 1,1,1-tris(hydroxymethyl)ethane, 1,2,4-butanetriol, trimethylolpropane, 1,2,4-trihydroxyhexane, 1,2,6-trihydroxyhexane, 1,2,3-heptanetriol, etc. These monovalent and trivalent alcohols can be mixed with the diol having $W_1$ as a partial structure when the diol is reacted, or can be added separately for use in the reaction.

The organic solvent used in the liquid separation and washing is not particularly limited, as long as it is capable of dissolving the target product and being separated into two layers when mixed with water. Examples of the organic solvent include hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-tert-butyl ether, and ethylcyclopentylmethyl ether; chlorinated solvents such as methylene chloride, chloroform, dichloroethane, and trichloroethylene; mixtures thereof; etc. As the water used for washing in this event, generally, what is called deionized water or ultrapure water may be used. The washing may be performed once or more, preferably approximately one to five times, because washing ten times or more does not always produce the full washing effects thereof.

In the liquid separation and washing, the washing may be performed with a basic aqueous solution to remove acidic components in the system. Specific examples of the base include hydroxides of alkaline metals, carbonates of alkaline metals, hydroxides of alkali earth metals, carbonates of alkali earth metals, ammonia, organic ammonium, etc.

Further, in the liquid separation and washing, the washing may be performed with an acidic aqueous solution to remove metal impurities or basic components in the system. Specific examples of the acid include inorganic acids such as hydrochloric acid, hydrobromic acid, sulfuric acid, nitric acid, phosphoric acid, and heteropoly acid; organic acids such as oxalic acid, fumaric acid, maleic acid, trifluoroacetic acid, methanesulfonic acid, benzenesulfonic acid, p-toluenesulfonic acid, and trifluoromethanesulfonic acid; etc.

The liquid separation and washing may be performed with any one of the basic aqueous solution and the acidic aqueous solution, or can be performed with a combination of the two. The liquid separation and washing is preferably performed with the basic aqueous solution and the acidic aqueous solution in this order from the viewpoint of removing the metal impurities.

After the liquid separation and washing with the basic aqueous solution and/or acidic aqueous solution, washing with neutral water may be successively performed. This washing may be performed once or more, preferably approximately one to five times. As the neutral water, deionized water, ultrapure water, or the like mentioned above may be used. The washing may be performed once or more, but if the washing is not performed sufficiently, the basic components and the acidic components may not be removed in some cases. The washing is performed preferably approximately one to five times because washing ten times or more does not always produce the full washing effects.

Further, the reaction product after the liquid separation operation can also be collected as a powder by concentrating and drying the solvent or crystallizing the reaction product under reduced pressure or normal pressure. Alternatively, the reaction product can be retained in a solution state with an appropriate concentration to improve the workability in preparing the material for forming an organic film. The concentration at this point is preferably 0.1 to 50 mass %, more preferably 0.5 to 30 mass %. With such a concentration, the viscosity is hardly increased, making it possible to prevent degradation of the workability; in addition, since the amount of the solvent is not excessive, the solution can be prepared economically.

The solvent in this event is not particularly limited, as long as it is capable of dissolving the polymer. Specific examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. One of these or a mixture of two or more thereof can be used.

As described above, the inventive polymer for forming an organic film enables the material for forming an organic film to exhibit high etching resistance and excellent twisting resistance.

<Material for Forming Organic Film>

Moreover, the present invention provides a material for forming an organic film, containing: the polymer having a repeating unit shown by the general formula (1); and an organic solvent. Note that, in the inventive material for forming an organic film, one kind of the inventive polymer having a partial structure shown by the general formula (1) can be used, or a combination of multiple kinds thereof can be used.

The organic solvent usable in the inventive material for forming an organic film is not particularly limited, as long as the organic solvent is capable of dissolving the inventive polymer for forming an organic film, and, if any, an acid generator, other additives to be described later, etc. For example, a solvent having a boiling point of lower than 180° C. can be used, such as solvents disclosed in paragraphs (0091) to (0092) of JP 2007-199653 A. Above all, it is preferable to use propylene glycol monomethyl ether acetate, propylene glycol monomethyl ether, 2-heptanone, cyclopentanone, cyclohexanone, and a mixture of two or more thereof.

Further, in the inventive material for forming an organic film, it is also possible to add, as a component of the organic solvent, a high-boiling-point solvent having a boiling point of 180° C. or higher to the above-described solvent having a boiling point of lower than 180° C. (a mixture of the solvent having a boiling point of lower than 180° C. and the solvent having a boiling point of 180° C. or higher). The high-boiling-point organic solvent is not particularly limited to hydrocarbons, alcohols, ketones, esters, ethers, chlorinated solvents, and so forth, as long as the high-boiling-point organic solvent is capable of dissolving the resin for forming an organic film. Examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol methyl-n-propyl ether, dipropylene glycol methyl ether acetate, 1,4-butanediol diacetate, 1,3-butylene glycol diacetate, 1,6-hexanediol diacetate, γ-butyrolactone, etc. One or a mixture of these may be used.

The boiling point of the high-boiling-point solvent may be appropriately selected according to the temperature at which the material for forming an organic film is heated. The boiling point of the high-boiling-point solvent to be added is preferably 180° C. to 300° C., more preferably 200° C. to 300° C. When the boiling point is 180° C. or more, the evaporation rate at baking (heating) is prevented from becoming excessive, which would otherwise occur if the boiling point is too low. Thus, sufficient thermal flowability can be obtained. Meanwhile, when the boiling point is 300° C. or less, the boiling point is not too high, so that the high-boiling-point solvent evaporates after baking and does not remain in the film. Thus, the film properties such as etching resistance are not affected.

When the high-boiling-point solvent is used, the high-boiling-point solvent is blended in an amount of preferably 1 to 30 parts by mass based on 100 parts by mass of the solvent having a boiling point of lower than 180° C. The high-boiling-point solvent in such a formulation amount prevents a failure in providing sufficient thermal flowability during baking, which would otherwise occur if the amount is too small; in addition, degradation of the film properties such as etching resistance is prevented, which would otherwise occur if the amount is so large that the high-boiling-point solvent remains in the film.

As described above, the resin for forming an organic film is provided with thermal flowability by adding the high-boiling-point solvent, so that the material for forming an organic film has both higher filling and planarizing properties.

In the inventive material for forming an organic film, an acid generator can be added so as to further promote the curing reaction. The acid generator includes a material that generates an acid by thermal decomposition, and a material that generates an acid by light irradiation. Any acid generator can be added. Specifically, materials disclosed in paragraphs (0061) to (0085) of JP 2007-199653 A can be added, but the present invention is not limited thereto.

One kind of the acid generator or a combination of two or more kinds thereof can be used. When the acid generator is added, the amount is preferably 0.05 to 50 parts, more preferably 0.1 to 10 parts, based on 100 parts of the polymer of the general formula (1).

To the inventive material for forming an organic film, a surfactant can be added so as to improve the coating property in spin coating. As the surfactant, for example, those disclosed in (0142) to (0147) of JP 2009-269953 A can be used.

Moreover, to the inventive material for forming an organic film, a compound having an aromatic ring as a partial structure can be added other than the polymer of the general formula (1). Examples of the compound that can be used include condensed resins known to be used in compositions for forming an organic underlayer film, and known aromatic ring-containing single-molecular compounds and polymer compounds such as radical polymers. Examples of the compound having an aromatic ring as a partial structure include, but are not limited to, compounds having the following repeating units, and the following compounds.

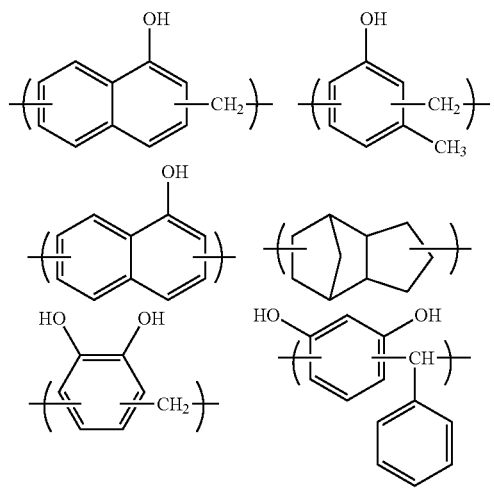

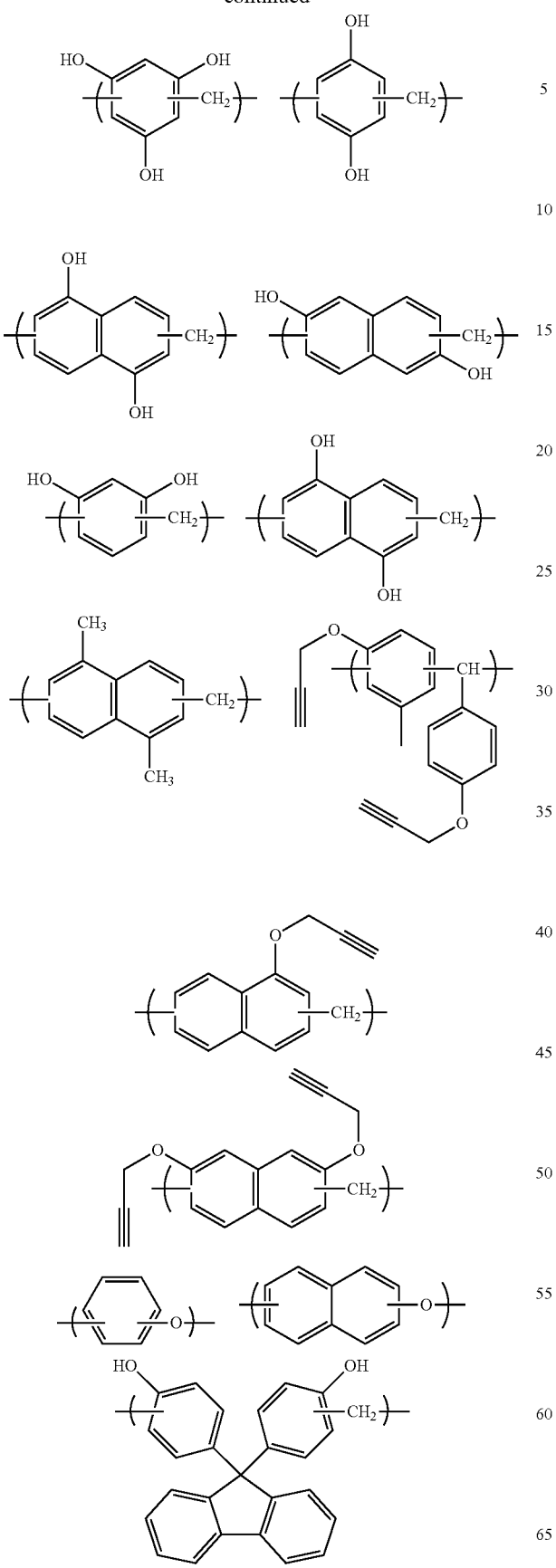
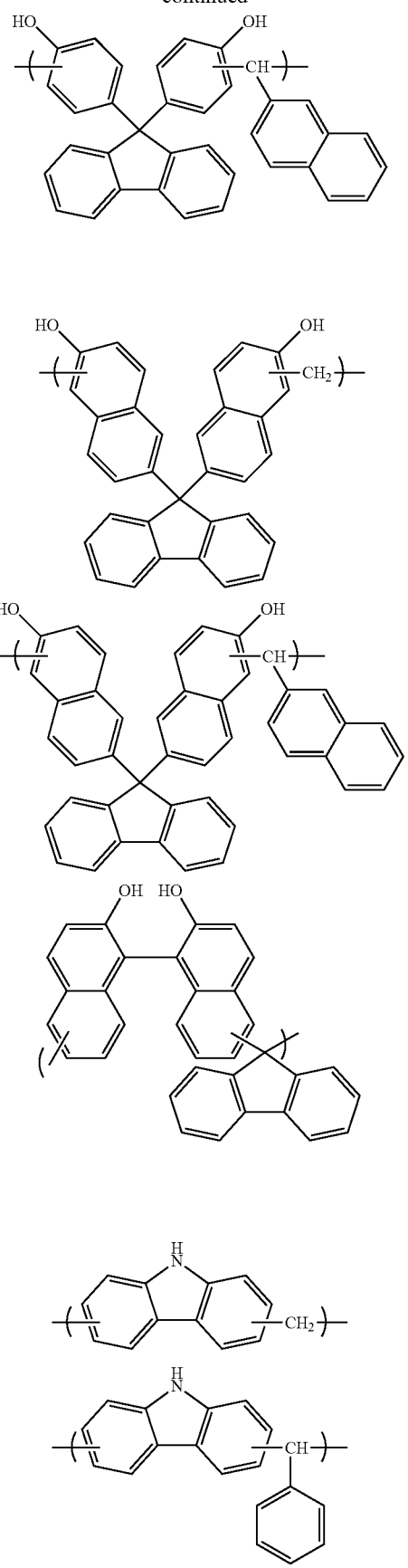

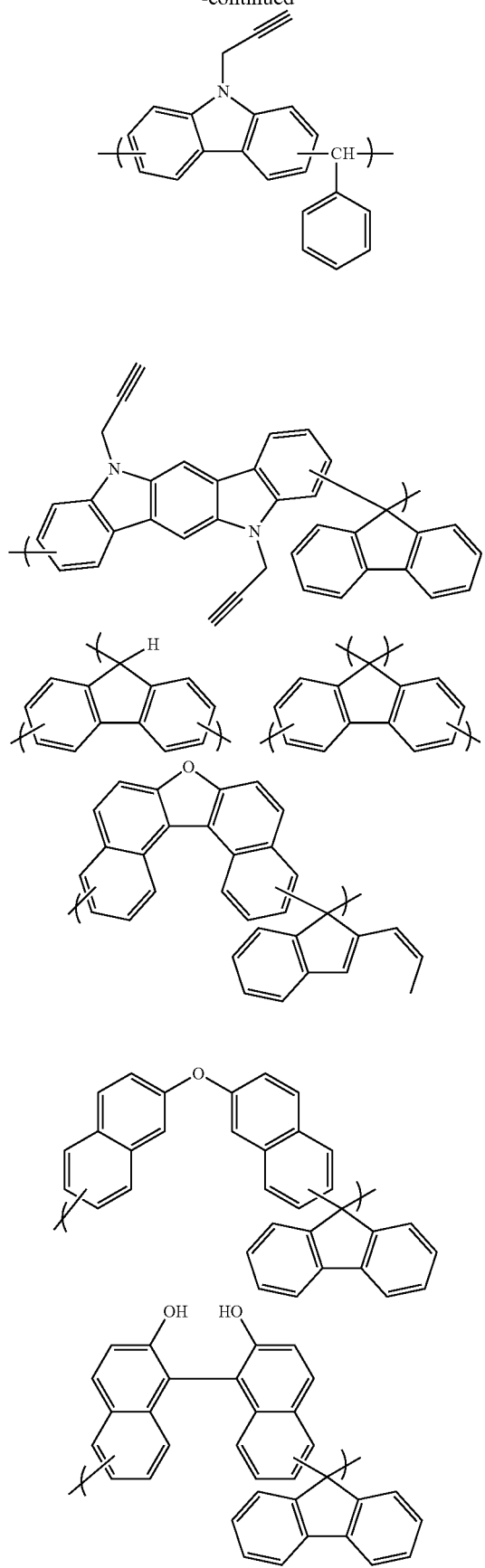
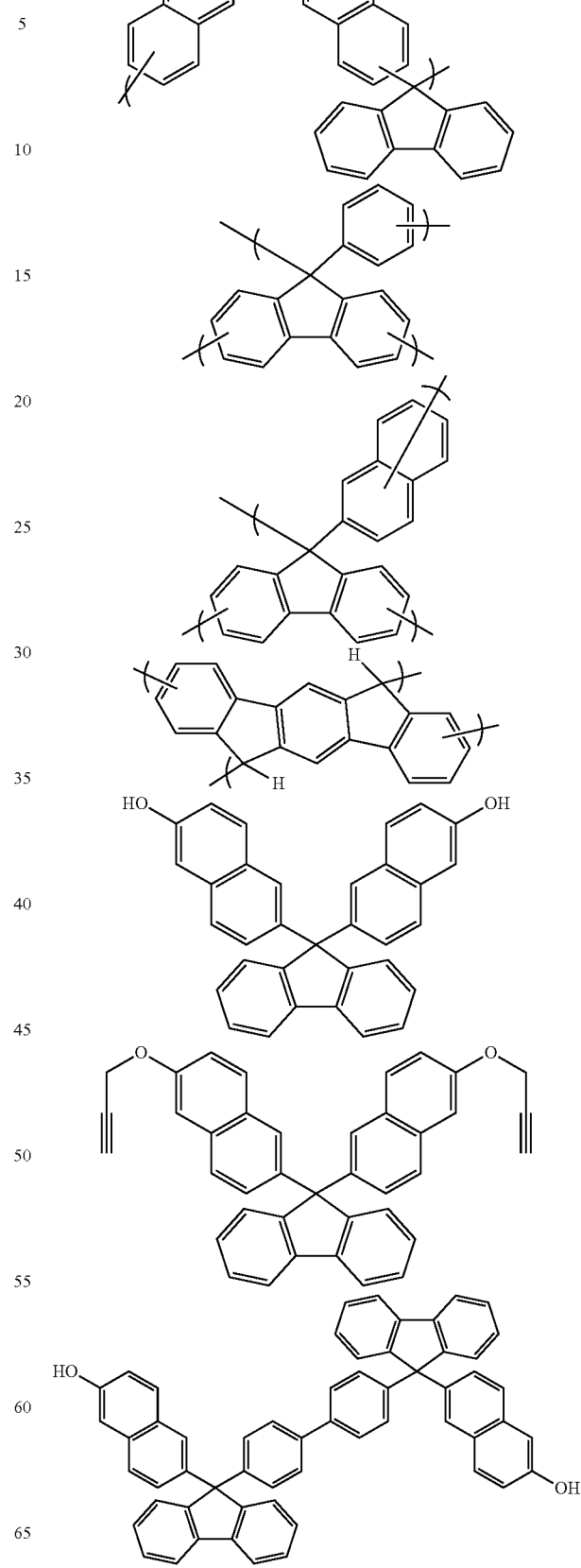

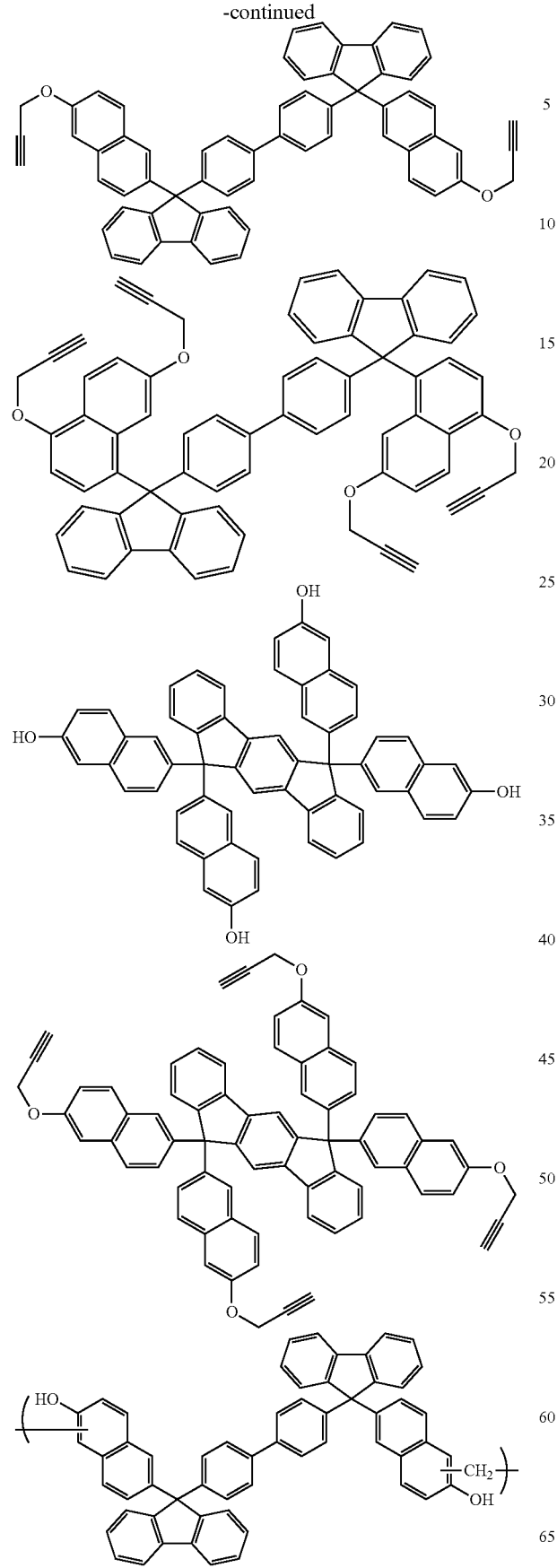
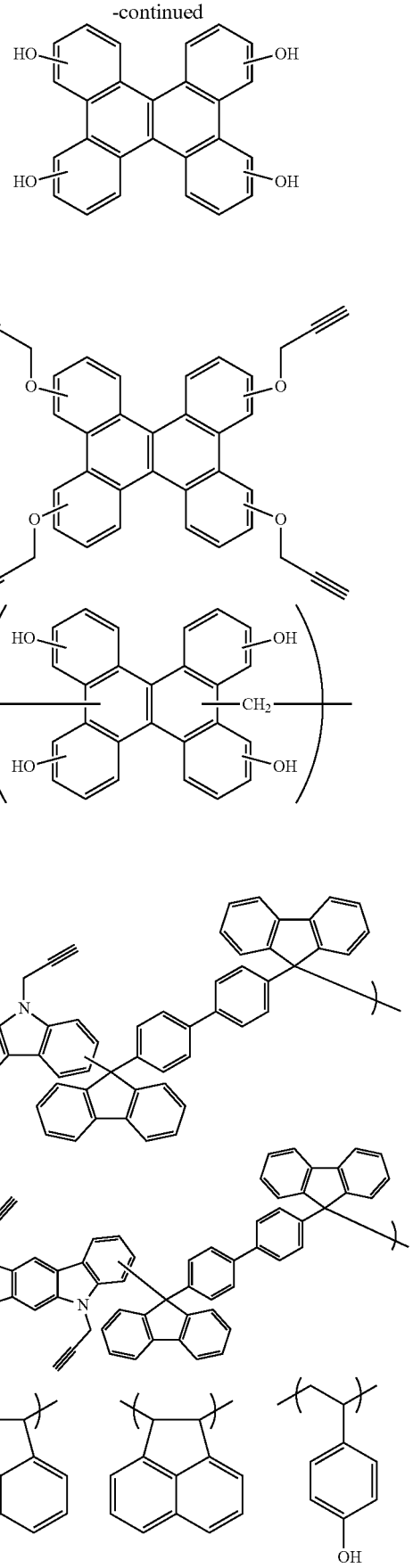

-continued

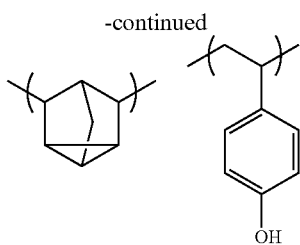

The compound having an aromatic ring as a partial structure has a weight-average molecular weight of preferably 500 to 100,000, further preferably 600 to 50,000. These ranges are preferable because the low-molecular-weight component does not volatilize out of the film during film formation by baking, and the material can keep the thermal flowability, making it possible to obtain sufficiently high characteristics of filling and planarizing a substrate.

Furthermore, to the inventive material for forming an organic film, a crosslinking agent can also be added so as to increase the curability and to further suppress intermixing with a film formed thereon. The crosslinking agent is not particularly limited, and known various types of crosslinking agents can be widely used. Examples thereof include methylolated- or methoxymethylated polynuclear phenol-based crosslinking agents, melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, and epoxy-based crosslinking agents.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the methylolated- or methoxymethylated polynuclear phenol-based crosslinking agents include bisphenols such as bisphenol A and bisphenol F that are subjected to tetramethylolation or tetramethoxymethylation; trisphenols such as triphenolmethane, triphenolethane, 1,1,1-tris(4-hydroxyphenyl)ethane, and tris(4-hydroxyphenyl)-1-ethyl-4-isopropylbenzene that are subjected to hexamethoxymethylation; partial condensates thereof, etc. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidenebis(4-benzyl-2-oxazoline), 2,2'-isopropylidenebis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Further, to the inventive material for forming an organic film, a plasticizer can be added so as to further improve the planarizing and filling properties. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

Further, like the plasticizer, as an additive for imparting the filling and planarizing properties to the inventive material for forming an organic film, it is preferable to use, for example, liquid additives having polyethylene glycol or polypropylene glycol structure, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

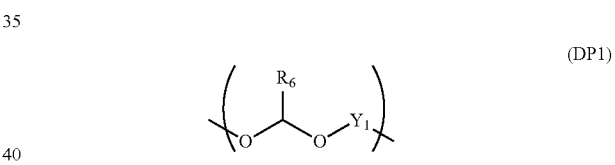

(DP1)

In the formula, $R_6$ represents a hydrogen atom or a saturated or unsaturated monovalent organic group which has 1 to 30 carbon atoms and may be substituted. $Y_1$ represents a saturated or unsaturated divalent organic group having 2 to 30 carbon atoms.

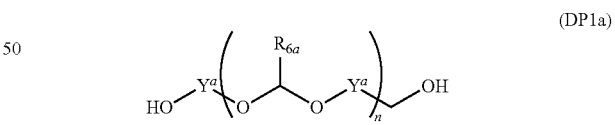

(DP1a)

In the formula, $R_{6a}$ represents an alkyl group having 1 to 4 carbon atoms. $Y^a$ represents a saturated or unsaturated divalent hydrocarbon group which has 4 to 10 carbon atoms and may have an ether bond. "n" represents an average repeating unit number of 3 to 500.

Note that one kind of the inventive material for forming an organic film can be used, or two or more kinds thereof can be used in combination. The material for forming an organic film can be used as a resist underlayer film material or a planarizing material for manufacturing a semiconductor device.

Moreover, the inventive material for forming an organic film is quite useful as a resist underlayer film material for multilayer resist processes such as a two-layer resist process, a three-layer resist process using a silicon-containing middle layer film, and a four-layer resist process using a silicon-containing inorganic hard mask middle layer film and an organic antireflective film.

<Method for Forming Organic Film>

The present invention provides a method for forming an organic film by using the above-described material for forming an organic film. The resulting organic film can serve as an organic film in a multilayer resist film used in lithography or a planarizing film for manufacturing a semiconductor.

In the inventive method for forming an organic film, a substrate to be processed is coated with the material for forming an organic film by a spin coating method etc. By employing a method like spin coating method, favorable filling property can be obtained. After the spin coating, the solvent is evaporated, and baking (heating) is performed to promote the crosslinking reaction, thereby preventing the mixing with a resist upper layer film or a resist underlayer film. The baking is preferably performed at 100° C. or more and 600° C. or less within 10 to 600 seconds, more preferably at 200° C. or more and 500° C. or less within 10 to 300 seconds. In considering the influences of device damage and wafer deformation, the upper limit of the heating temperature in lithographic wafer process is preferably 600° C. or less, more preferably 500° C. or less.

Moreover, in the inventive method for forming an organic film, after a substrate to be processed is coated with the inventive material for forming an organic film by the spin coating method or the like as described above, an organic film can be formed by curing the material for forming an organic film by baking in an atmosphere with an oxygen concentration of 0.1% or more and 21% or less.

A sufficiently cured organic film can be obtained by baking the inventive material for forming an organic film in such an oxygen atmosphere. The atmosphere during the baking may be in air. Nevertheless, it is preferable to introduce an inert gas such as $N_2$, Ar, or He to reduce oxygen amount from the viewpoint of preventing oxidation of the organic film. To prevent the oxidation, the oxygen concentration needs to be controlled, and is preferably 1000 ppm or less, more preferably 100 ppm or less. Preventing the oxidation of the organic film during baking is preferable because an increase in absorption and a decrease in etching resistance are prevented.

The inventive method for forming an organic film as described above makes it possible to obtain a flat organic film regardless of unevenness of a substrate to be processed, because of the excellent filling and planarizing properties. Accordingly, the method is quite useful in forming a flat organic film on a substrate to be processed which has a structure or step with a height of 30 nm or more.

Note that the thickness of the organic film such as an organic film in lithography or a planarizing film for manufacturing a semiconductor device is appropriately determined and preferably 30 to 20,000 nm, more preferably 50 to 15,000 nm.

(Patterning Processes)

The present invention provides a patterning process according to a three-layer resist process using such a material for forming an organic film as described above. The patterning process is a method for forming a pattern in a substrate to be processed, and includes at least:

forming an organic film by using the inventive material for forming an organic film on a body to be processed;

forming a silicon-containing resist underlayer film by using a silicon-containing resist underlayer film material on the organic film;

forming a resist upper layer film by using a photoresist composition on the silicon-containing resist underlayer film;

forming a circuit pattern in the resist upper layer film;

transferring the pattern to the silicon-containing resist underlayer film by etching using the resist upper layer film having the formed pattern as a mask;

transferring the pattern to the organic film by etching using the silicon-containing resist underlayer film having the transferred pattern as a mask; and further forming the pattern in the body to be processed by etching using the organic film having the transferred pattern as a mask.

The silicon-containing resist underlayer film in this three-layer resist process exhibits etching resistance to an oxygen gas or a hydrogen gas. Thus, when the organic film is dry-etched using the silicon-containing resist underlayer film as a mask in the three-layer resist process, the dry etching is preferably performed using an etching gas mainly containing an oxygen gas or a hydrogen gas.

As the silicon-containing resist underlayer film in the three-layer resist process, a polysiloxane-based underlayer film is also preferably used. The silicon-containing resist underlayer film having antireflective effect can suppress the reflection. Particularly, for 193-nm light exposure, a material containing many aromatic groups and having high etching selectivity relative to the substrate is used as an organic film, so that the k-value and thus the substrate reflection are increased. In contrast, the reflection can be suppressed by imparting absorption to the silicon-containing resist underlayer film so as to have an appropriate k-value, and the substrate reflection can be reduced to 0.5% or less. As the silicon-containing resist underlayer film having antireflective effect, a polysiloxane is preferably used which has anthracene for 248-nm and 157-nm light exposure, or a phenyl group or a light-absorbing group having a silicon-silicon bond for 193-nm light exposure in a pendant structure, and which is crosslinked by an acid or heat.

An organic antireflective film (BARC) may be formed on the silicon-containing resist underlayer film. In this case, a pattern can be formed in a body to be processed by a patterning process including:

forming an organic film by using the inventive material for forming an organic film on a body to be processed;

forming a silicon-containing resist underlayer film by using a silicon-containing resist underlayer film material on the organic film;

forming an organic antireflective film on the silicon-containing resist underlayer film;

forming a resist upper layer film by using a photoresist composition on the organic antireflective film, so that a 4-layered film structure is constructed;

forming a circuit pattern in the resist upper layer film;

transferring the pattern to the organic antireflective film and the silicon-containing resist underlayer film by etching (for example, successively) using the resist upper layer film having the formed pattern as a mask;

transferring the pattern to the organic film by etching using the silicon-containing resist underlayer film having the transferred pattern as a mask; and further forming the pattern in the body to be processed by etching using the organic film having the transferred pattern as a mask.

Alternatively, an inorganic hard mask may be formed as the resist underlayer film. In this case, a pattern can be formed in a body to be processed by a patterning process including:

forming an organic film by using the inventive material for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask;

forming a circuit pattern in the resist upper layer film;

transferring the pattern to the inorganic hard mask by etching using the resist upper layer film having the formed pattern as a mask;

transferring the pattern to the organic film by etching using the inorganic hard mask having the transferred pattern as a mask; and further forming the pattern in the body to be processed by etching using the organic film having the transferred pattern as a mask.

In the case where an inorganic hard mask is formed on the organic film as described above, a silicon oxide film, a silicon nitride film, and a silicon oxynitride film (SiON film) can be formed by a CVD method, an ALD method, or the like. The method for forming a silicon nitride film is disclosed in, for example, JP 2002-334869 A and WO 2004/066377 A1. The film thickness of the inorganic hard mask is preferably 5 to 200 nm, more preferably 10 to 100 nm. As the inorganic hard mask, a SiON film is most preferably used which is effective as an antireflective film. When the SiON film is formed, the substrate temperature reaches 300 to 500° C. Hence, the film therebelow needs to withstand the temperature of 300 to 500° C. Since the material for forming an organic film used in the present invention has high heat resistance and can withstand high temperatures of 300° C. to 500° C., this enables the combination of the inorganic hard mask formed by a CVD method or an ALD method with the organic film formed by a spin coating method.

Moreover, the present invention is suitable for a four-layer resist process using BARC, too. In this case, a pattern can be formed in a body to be processed by a patterning process including:

forming an organic film by using the inventive material for forming an organic film on a body to be processed;

forming an inorganic hard mask selected from a silicon oxide film, a silicon nitride film, and a silicon oxynitride film on the organic film;

forming an organic antireflective film on the inorganic hard mask;

forming a resist upper layer film by using a photoresist composition on the organic antireflective film, so that a 4-layered film structure is constructed, forming a circuit pattern in the resist upper layer film;

transferring the pattern to the organic antireflective film and the inorganic hard mask by etching (for example, successively) using the resist upper layer film having the formed pattern as a mask;

transferring the pattern to the organic film by etching using the inorganic hard mask having the transferred pattern as a mask; and further forming the pattern in the body to be processed by etching using the organic film having the transferred pattern as a mask.

Although a photoresist film may be formed as a resist upper layer film on an inorganic hard mask, it is also possible to form a BARC on the inorganic hard mask by spin coating and then form the photoresist film on the BARC as described above. Particularly, when a SiON film is used as the inorganic hard mask, two antireflective films including the SiON film and the BARC make it possible to suppress the reflection even in liquid immersion exposure at a high NA exceeding 1.0. Another merit of the BARC formation is having an effect of reducing trailing of the photoresist pattern immediately above the SiON film.

The resist upper layer film in the three-layer resist process may be a positive type or a negative type, and any generally-used photoresist composition can be employed. After spin coating of the photoresist composition, pre-baking is preferably performed within ranges of 60 to 180° C. and 10 to 300 seconds. Then, light exposure, post-exposure bake (PEB), and development are performed according to conventional methods to obtain a resist pattern. Note that the thickness of the resist upper layer film is not particularly limited, but is preferably 30 to 500 nm; particularly, the thickness of 50 to 400 nm is more preferable.

In addition, the exposure light includes high energy beam with a wavelength of 300 nm or less; specifically, excimer laser of 248 nm, 193 nm, or 157 nm, soft X-ray of 3 to 20 nm, electron beam, X-ray, etc.

In the inventive patterning processes, a photolithography with a wavelength of 10 nm or more and 300 nm or less, direct drawing with electron beam, nanoimprinting, or a combination thereof is preferably employed as the method for forming the circuit pattern in the resist upper layer film.

Additionally, in the inventive patterning processes, development with an alkali or organic solvent is preferably employed as a development method.

Next, using the resulting resist pattern as a mask, etching is performed. In the three-layer resist process, the silicon-containing resist underlayer film or the inorganic hard mask is etched using a fluorocarbon-based gas and the upper layer resist pattern as the mask. Thereby, a silicon-containing resist underlayer film pattern or an inorganic hard mask pattern is formed.

Next, using the obtained silicon-containing resist underlayer film pattern or inorganic hard mask pattern as a mask, the organic film is processed by etching.

Subsequently, the body to be processed (e.g. substrate to be processed) can be etched according to a conventional method. For example, the substrate to be processed made of $SiO_2$, SiN, or silica low-dielectric insulating film is etched mainly with a fluorocarbon-based gas; and the substrate to be processed made of p-Si, Al, or W is etched mainly with a chlorine- or bromine-based gas. When the substrate is processed by etching with a fluorocarbon-based gas, the silicon-containing resist underlayer film pattern in the three-layer resist process is removed when the substrate is processed. Meanwhile, when the substrate is etched with a chlorine- or bromine-based gas, the silicon-containing resist underlayer film pattern needs to be removed by additional dry etching with a fluorocarbon-based gas after the substrate processing.

The organic film obtained from the inventive material for forming an organic film is characterized by excellent etching resistance when the substrate to be processed is etched as described above.

In the inventive patterning processes, as the body to be processed, it is preferable to use a semiconductor device substrate, a metal film, a metal carbide film, a metal oxide film, a metal nitride film, a metal oxycarbide film, or a metal oxynitride film.

Further, as the metal, it is preferable to use silicon, titanium, tungsten, hafnium, zirconium, chromium, germanium, cobalt, copper, silver, gold, aluminum, indium, gallium, arsenic, palladium, iron, tantalum, iridium, molybdenum, ruthenium, or an alloy thereof.

Note that the substrate to be processed is not particularly limited, and examples thereof include substrates made of Si, α-Si, p-Si, $SiO_2$, SiN, SiON, W, TiN, Al, or the like; these substrates coated with a layer to be processed; etc. Examples of the layer to be processed include various Low-k films made of Si, $SiO_2$, SiON, SiN, p-Si, α-Si, W, W—Si, Al, Cu, Al—Si, or the like; and stopper films thereof. Generally, the layer can be formed to have a thickness of preferably 50 to 10,000 nm, more preferably 100 to 5,000 nm. Note that when the layer to be processed is formed, the substrate and the layer to be processed are formed from different materials.

Furthermore, it is preferable to use the substrate to be processed which has a structure or step with a height of 30 nm or more.

Hereinbelow, an example of the three-layer resist process will be specifically described with reference to FIG. 1.

As shown in FIG. 1(A), in the three-layer resist process, an organic film 3 is formed by using the inventive material for forming an organic film on a layer 2 to be processed which has been stacked on a substrate 1. Then, a silicon-containing resist underlayer film 4 is formed, and a resist upper layer film 5 is formed thereon.

Next, as shown in FIG. 1(B), a predetermined portion 6 of the resist upper layer film is exposed to light, followed by PEB and development to form a resist pattern 5a (FIG. 1(C)). Using the resulting resist pattern 5a as a mask, the silicon-containing resist underlayer film 4 is etched with a CF-based gas. Thereby, a silicon-containing resist underlayer film pattern 4a is formed (FIG. 1(D)). After the resist pattern 5a is removed, the organic film 3 is etched with oxygen plasma using the resulting silicon-containing resist underlayer film pattern 4a as a mask. Thereby, an organic film pattern 3a is formed (FIG. 1(E)). Further, after the silicon-containing resist underlayer film pattern 4a is removed, the layer 2 to be processed is etched using the organic film pattern 3a as a mask. Thus, a pattern 2a is formed (FIG. 1(F)).

When an inorganic hard mask is used, the inorganic hard mask is formed in place of the silicon-containing resist underlayer film 4. When a BARC is formed, the BARC layer is provided between the silicon-containing resist underlayer film 4 or the inorganic hard mask and the resist upper layer film 5. The etching of the BARC starts before the etching of the silicon-containing resist underlayer film 4, but these etchings may be performed continuously. Alternatively, after the BARC is etched alone, for example, the etching apparatus is changed, and then the etching of the silicon-containing resist underlayer film 4 may be started.

As described above, when a pattern is formed, the use of the inventive material for forming an organic film as a resist underlayer film material makes it possible to precisely transfer and form the pattern of an upper layer photoresist in a body to be processed.

EXAMPLE

Hereinafter, the present invention will be further specifically described by referring to Synthesis Examples, Examples, and Comparative Examples. However, the present invention is not limited thereto. Note that, regarding molecular weight and dispersity, gel permeation chromatography (GPC) was performed using tetrahydrofuran as an eluent to determine weight-average molecular weight (Mw) and number-average molecular weight (Mn) in terms of polystyrene, and dispersity (Mw/Mn) was obtained therefrom.

Synthesis Examples: Synthesis of Polymers for Organic Film Material

Polymers (A1) to (A8) for organic film material were synthesized using the following Compounds B: (B1) to (B5) and Compounds C: (C1) to (C4).

Compounds B:

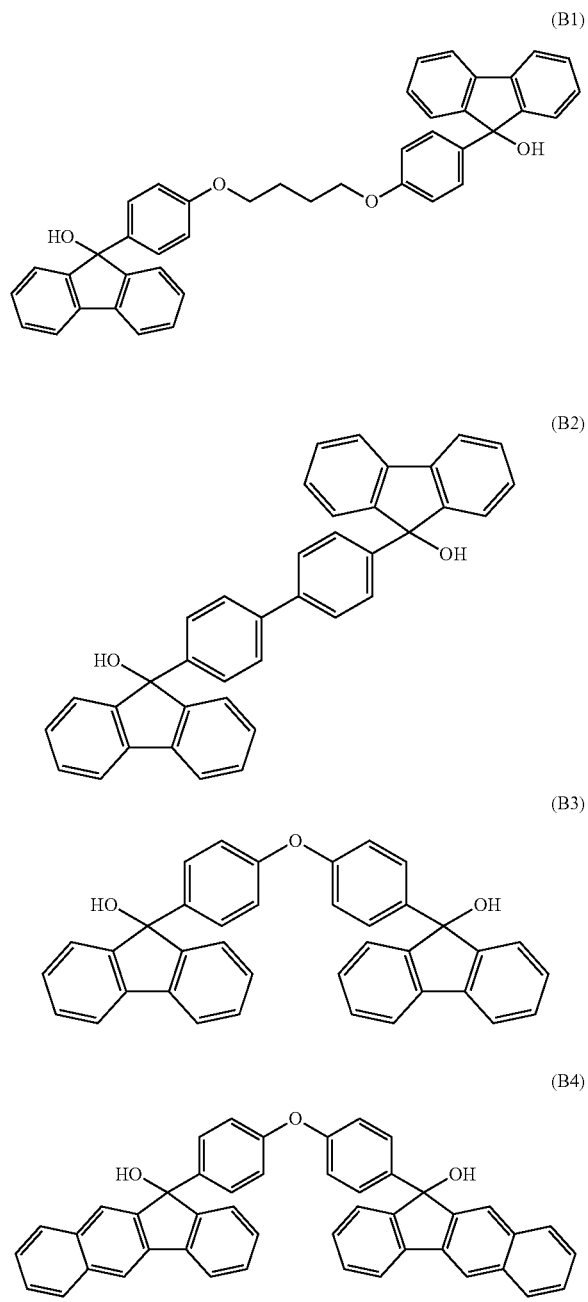

(B5)

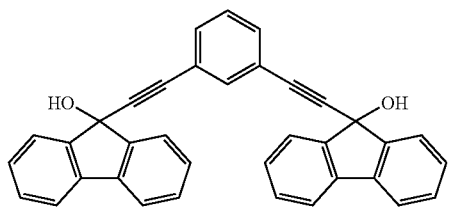

Compounds C:

(C1)
(C2)
(C3)
(C4)

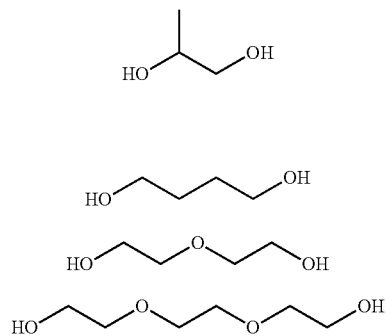

[Synthesis Example 1] Synthesis of Polymer (A1)

Under a nitrogen atmosphere, a suspension with an inner temperature of 60° C. was prepared from 50.0 g of Compound (B1), 31.6 g of Compound (C1), and 300 g of 1,2-dichloroethane. Then, 8 ml of methanesulfonic acid was slowly added thereto. After confirming that the heat generation ended, the reaction was allowed to proceed with the inner temperature of 60° C. for 6 hours. After cooling to room temperature, 500 ml of methyl isobutyl ketone was added to the resultant, and the organic layer was washed six times with 100 g of pure water. Subsequently, the organic layer was dried under reduced pressure. To the residue, 150 g of tetrahydrofuran (THF) was added to form a homogeneous solution. Thereafter, the polymer was reprecipitated with 1000 g of hexane. The precipitated polymer was separated by filtration, washed twice with 300 g of hexane, and collected. The collected polymer was vacuum dried at 50° C. Thus, Polymer (A1) was obtained. When the weight-average molecular weight (Mw) and dispersity (Mw/Mn) was determined by GPC, the following results were obtained.

(A1)

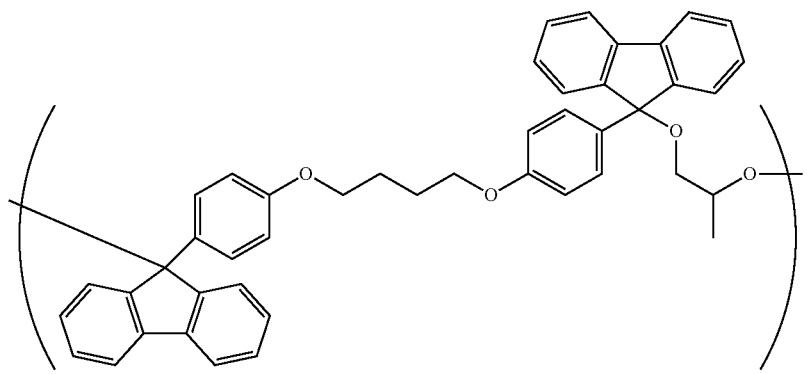

(A1): Mw = 2120, Mw/Mn = 1.83

[Synthesis Examples 2 to 18] Synthesis of Polymers (A2) to (A8)

Polymers (A2) to (A8) were obtained as products under the same reaction conditions as those in Synthesis Example 1, except that Compounds B and Compounds C as shown in Table 1 were used. Table 2 shows the weight-average molecular weight (Mw) and dispersity (Mw/Mn) of these polymers.

TABLE 1

| Synthesis Example | Compounds B | Compounds C | Polymer |
|---|---|---|---|
| 1 | B1: 50.0 g | C1: 31.6 g | A1 |
| 2 | B2: 50.0 g | C2: 43.8 g | A2 |

TABLE 1-continued

| Synthesis Example | Compounds B | Compounds C | Polymer |
|---|---|---|---|
| 3 | B2: 50.0 g | C3: 51.5 g | A3 |
| 4 | B3: 50.0 g | C3: 50.0 g | A4 |
| 5 | B3: 50.0 g | C4: 70.8 g | A5 |
| 6 | B4: 50.0 g | C1: 30.2 g | A6 |
| 7 | B4: 50.0 g | C2: 35.7 g | A7 |
| 8 | B5: 50.0 g | C4: 77.2 g | A8 |

TABLE 2

| Synthesis Example | Polymer | Mw | Mw/Mn |
|---|---|---|---|
| 1 | 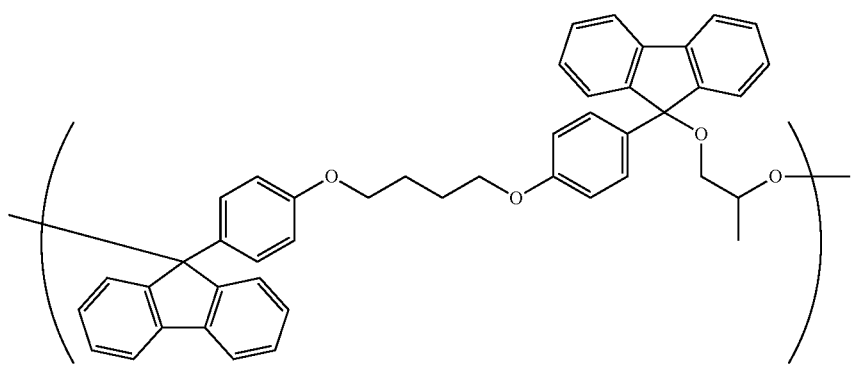 (A1) | 2120 | 1.83 |
| 2 | 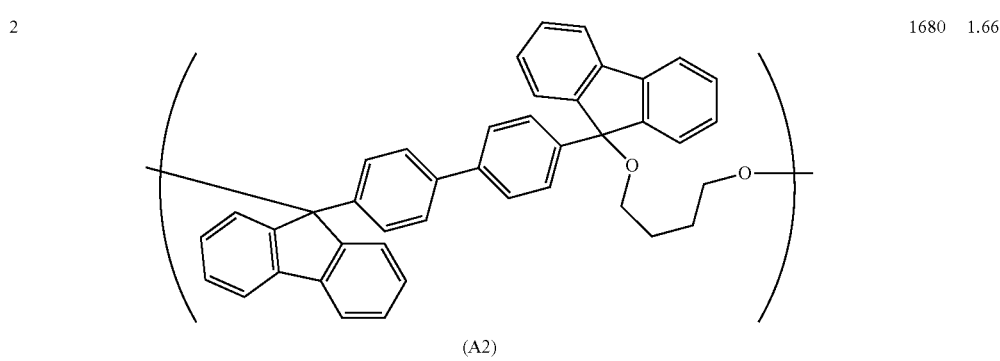 (A2) | 1680 | 1.66 |
| 3 | 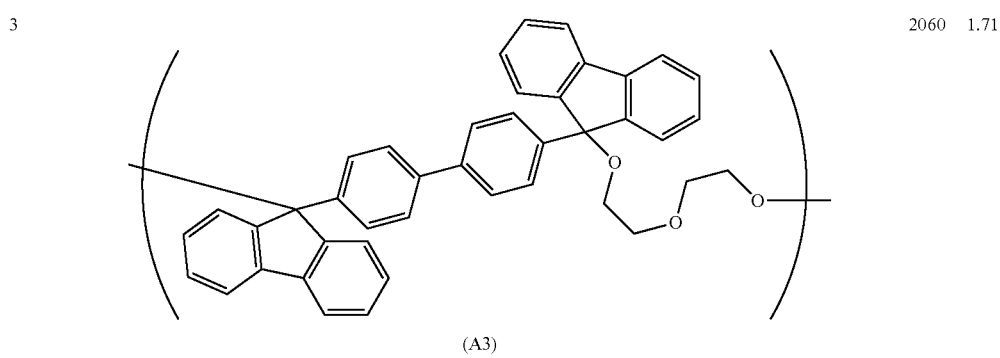 (A3) | 2060 | 1.71 |

TABLE 2-continued

| Synthesis Example | Polymer | Mw | Mw/Mn |
|---|---|---|---|
| 4 | (A4) | 1900 | 1.88 |
| 5 | (A5) | 2250 | 1.63 |
| 6 | (A6) | 1750 | 1.58 |
| 7 | (A7) | 2080 | 1.73 |
| 8 | (A8) | 2320 | 1.98 |

Example 1: Solvent Solubility Test (Examples 1-1 to 1-8, Comparative Examples 1-1 to 1-5)

Polymers (A1) to (A8) described above and Compounds (B1) to (B5) as Comparative Examples were subjected to a solvent solubility test. In the solvent solubility test, PGME (propylene glycol monomethyl ether), PGEE (propylene glycol monoethyl ether), propylene glycol monomethyl ether acetate (PGMEA), cyclohexanone (CyHO), and GBL (γ-butyrolactone) were used. As the test procedure, Polymers (A1) to (A8) and Compounds (B1) to (B5) were mixed with the solvents so as to make each solution have concentrations of 10 wt % and 20 wt %, and the solution state at room temperature was visually checked. The test results were evaluated as "A" when the polymer or compound was completely dissolved at the concentration of 20 wt %, too; "B" when the polymer or compound was dissolved only at the concentration of 10 wt %; and "C" when an undissolved residue was found even at the concentration of 10 wt %. Table 3 shows a summary of the results.

TABLE 3

| | Polymer or Compound | PGME | PGEE | PGMEA | CyHO | GBL |
|---|---|---|---|---|---|---|
| Example 1-1 | A1 | B | B | B | A | A |
| Example 1-2 | A2 | B | A | A | A | A |
| Example 1-3 | A3 | A | A | A | A | A |
| Example 1-4 | A4 | A | A | A | A | A |
| Example 1-5 | A5 | A | A | A | A | A |
| Example 1-6 | A6 | B | B | B | A | A |
| Example 1-7 | A7 | B | B | B | A | A |
| Example 1-8 | A8 | A | A | A | A | A |
| Comparative Example 1-1 | B1 | C | C | C | A | A |
| Comparative Example 1-2 | B2 | C | C | C | C | C |
| Comparative Example 1-3 | B3 | C | C | C | B | B |
| Comparative Example 1-4 | B4 | C | C | C | A | B |
| Comparative Example 1-5 | B5 | C | C | B | A | A |

As shown in Table 3, Examples (Examples 1-1 to 1-8) using the inventive polymers demonstrated the solvent solubility of 10 wt % or more in all the solvents. The comparison with Comparative Examples (Comparative Examples 1-1 to 1-5) shows that forming the polymers improves the solvent solubility. Examples 1-3, 1-4, 1-5, and 1-8 demonstrated the solvent solubility of at least 20 wt % in all the solvents, suggesting that introducing a glyme structure into the main chain further improves the solvent solubility. Since Compound (B2) did not exhibit sufficient solvent solubility for use in an organic film material (material for forming an organic film), the following evaluation as organic film material were not carried out.

PREPARATION of Organic Film Materials (UDL-1 to -16, Comparative Example UDL-1 to -10)

Polymers (A1) to (A8) and Compounds (B1), (B3) to (B5) as the compounds for Comparative Examples described above were dissolved in proportions shown in Table 4 using a solvent of propylene glycol monomethyl ether acetate (PGMEA) or cyclohexanone (CyHO) both of which contained 0.1 mass % FC-4430 (manufactured by Sumitomo 3M Ltd.), and optionally using polymers and compound (D1) to (D3) having an aromatic ring as a partial structure, a crosslinking agent (CR1) and an acid generator (AG1) as additives, and (S1) 1,6-diacetoxyhexane (boiling point: 260° C.) and (S2) tripropylene glycol monomethyl ether (boiling point: 242° C.) as high-boiling-point solvents. The solutions were filtered through a 0.1-μm filter made of a fluorinated resin to prepare materials (UDL-1 to -16, Comparative Example UDL-1 to -10) for forming an organic film. As described in the solvent solubility test, since the solubility of Compound (B2) into the solvents were not guaranteed, this compound was not adopted to prepare an organic film material.

TABLE 4

| Organic film material | Polymer or Compound (parts by mass) | Crosslinking agent (parts by mass) | Acid generator (parts by mass) | High-boiling-point solvent (parts by mass) | CyHO (parts by mass) | PGMEA (parts by mass) |
|---|---|---|---|---|---|---|
| UDL-1 | A1(10) | — | — | — | — | 90 |
| UDL-2 | A2(10) | — | — | — | — | 90 |
| UDL-3 | A3(10) | — | — | — | — | 90 |
| UDL-4 | A4(10) | — | — | — | — | 90 |
| UDL-5 | A5(10) | — | — | — | — | 30 |
| UDL-6 | A6(10) | — | — | — | — | 90 |
| UDL-7 | A7(10) | — | — | — | — | 30 |
| UDL-8 | A8(10) | — | — | — | — | 90 |
| UDL-9 | A2(10) | — | AG1(0.5) | — | — | 90 |
| UDL-10 | A4(10) | — | AG1(0.5) | — | — | 90 |
| UDL-11 | A8(10) | — | AG1(0.5) | — | — | 30 |
| UDL-12 | A3(2) D1(8) | — | AG1(0.5) | — | — | 30 |
| UDL-13 | A5(2) D2(8) | — | AG1(0.5) | — | — | 90 |
| UDL-14 | A7(2) D3(8) | — | AG1(0.5) | — | — | 90 |
| UDL-15 | A5(10) | — | — | S1(10) | — | 80 |
| UDL-16 | A8(10) | — | — | S2(10) | — | 80 |
| Comparative Example UDL-1 | B1(10) | — | — | — | 90 | — |
| Comparative Example UDL-2 | B3(10) | — | — | — | 90 | — |
| Comparative Example UDL-3 | B4(10) | — | — | — | 90 | — |
| Comparative Example UDL-4 | B5(10) | — | — | — | — | 90 |
| Comparative Example UDL-5 | B3(2) D1(8) | — | AG1(0.5) | — | 90 | — |
| Comparative Example UDL-6 | B4(2) D2(8) | — | AG1(0.5) | — | 90 | — |

TABLE 4-continued

| Organic film material | Polymer or Compound (parts by mass) | Crosslinking agent (parts by mass) | Acid generator (parts by mass) | High-boiling-point solvent (parts by mass) | CyHO (parts by mass) | PGMEA (parts by mass) |
|---|---|---|---|---|---|---|
| Comparative Example UDL-7 | B5(2) D3(8) | — | AG1(0.5) | — | — | 90 |
| Comparative Example UDL-8 | D1(8) | CR1(2) | AG1(0.5) | — | 90 | — |
| Comparative Example UDL-9 | D2(8) | CR1(2) | AG1(0.5) | — | — | 90 |
| Comparative Example UDL-10 | D3(8) | CR1(2) | AG1(0.5) | — | — | 90 |

The structural formulae of the polymers and compound (D1) to (D3) having an aromatic ring as a partial structure, the acid generator (AG1), and the crosslinking agent (CR1) used in UDLs of Examples and Comparative Examples are shown below.

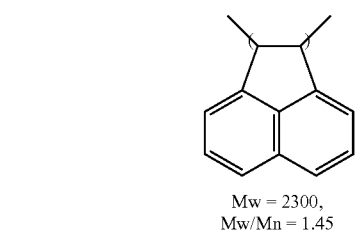
(D1)
Mw = 2300, Mw/Mn = 1.45

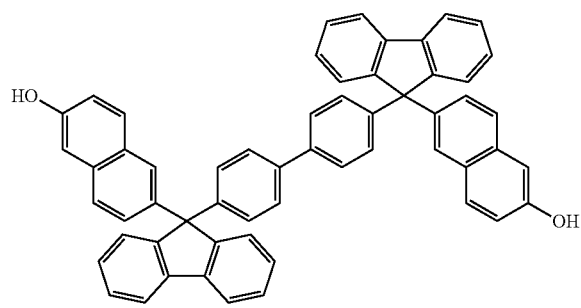
(D2)
Mw = 3050, Mw/Mn = 1.93

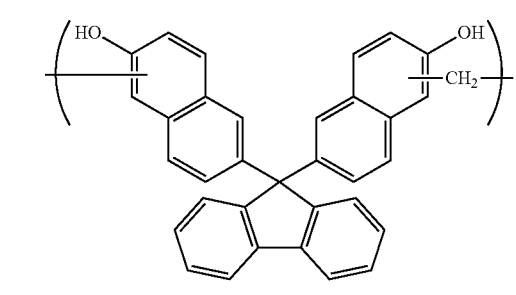
(D3)

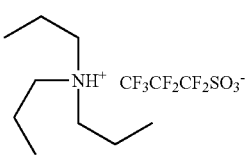
AG1

CR1

Example 2: Coatability Test (Examples 2-1 to 2-16, Comparative Examples 2-1 to 2-4)

The organic film materials (UDL-1 to -16, Comparative Example UDL-1 to -4) were each applied onto a Bare-Si substrate, a SiO$_2$ substrate treated with hexamethyldisilazane (HMDS), and a substrate treated with SiON, which are shown in Table 5, and baked in the atmosphere at 250° C. or 350° C. for 60 seconds to form an organic film having a film thickness of 200 nm. The organic films thus formed were observed with naked eyes or an optical microscope (ECLIPSE L200 manufactured by Nikon INSTECH CO., LTD.) to check the coating abnormality. Table 5 shows the baking conditions and the coatability observation results.

TABLE 5

| | Organic film material | Baking condition | Bare-Si substrate | HMDS-treated substrate | SiON-treated substrate |
|---|---|---|---|---|---|
| Example 2-1 | UDL-1 | 350° C. × 60 sec. | no abnormality | no abnormality | no abnormality |
| Example 2-2 | UDL-2 | 350° C. × 60 sec. | no abnormality | no abnormality | no abnormality |
| Example 2-3 | UDL-3 | 350° C. × 60 sec. | no abnormality | no abnormality | no abnormality |
| Example 2-4 | UDL-4 | 350° C. × 60 sec. | no abnormality | no abnormality | no abnormality |
| Example 2-5 | UDL-5 | 350° C. × 60 sec. | no abnormality | no abnormality | no abnormality |
| Example 2-6 | UDL-6 | 350° C. × 60 sec. | no abnormality | no abnormality | no abnormality |
| Example 2-7 | UDL-7 | 350° C. × 60 sec. | no abnormality | no abnormality | no abnormality |
| Example 2-8 | UDL-8 | 350° C. × 60 sec. | no abnormality | no abnormality | no abnormality |
| Example 2-9 | UDL-9 | 250° C. × 60 sec. | no abnormality | no abnormality | no abnormality |
| Example 2-10 | UDL-10 | 250° C. × 60 sec. | no abnormality | no abnormality | no abnormality |
| Example 2-11 | UDL-11 | 250° C. × 60 sec. | no abnormality | no abnormality | no abnormality |
| Example 2-12 | UDL-12 | 250° C. × 60 sec. | no abnormality | no abnormality | no abnormality |
| Example 2-13 | UDL-13 | 250° C. × 60 sec. | no abnormality | no abnormality | no abnormality |
| Example 2-14 | UDL-14 | 250° C. × 60 sec. | no abnormality | no abnormality | no abnormality |
| Example 2-15 | UDL-15 | 350° C. × 60 sec. | no abnormality | no abnormality | no abnormality |
| Example 2-16 | UDL-16 | 350° C. × 60 sec. | no abnormality | no abnormality | no abnormality |
| Comparative Example 2-1 | Comparative Example UDL-1 | 350° C. × 60 sec. | opaque film was formed | opaque film was formed | opaque film was formed |
| Comparative Example 2-2 | Comparative Example UDL-2 | 350° C. × 60 sec. | opaque film was formed | opaque film was formed | opaque film was formed |
| Comparative Example 2-3 | Comparative Example UDL-3 | 350° C. × 60 sec. | opaque film was formed | opaque film was formed | opaque film was formed |
| Comparative Example 2-4 | Comparative Example UDL-4 | 350° C. × 60 sec. | no abnormality | pinhole defect | pinhole defect |

As shown in Table 5, in Examples 2-1 to 2-16 in which organic films were formed using UDL-1 to UDL-16 of the present invention, uniform organic films were successfully formed without coating abnormality regardless of the substrates. In Comparative Examples 2-1 to 2-4, since the monomer compounds were used, it was visually confirmed that frosted glass-like, non-uniform films were formed due to the high crystallinity and low solvent solubility. Even when the compound having relatively better solvent solubility was used, agglomeration is likely to occur depending on the substrate, so that many pinhole-like coating defects which seemed splash were observed under the optical microscope. This result also showed that the inventive polymers are capable of forming a favorable organic film without substrate dependency.

Example 3: Solvent Resistance Measurement
(Examples 3-1 to 3-16, Comparative Examples 3-1 to 3-10)

UDL-1 to -16 and Comparative Example UDL-1 to -10 prepared above were each applied onto a silicon substrate, and baked in the atmosphere at 250° C. or 350° C. for 60 seconds. Then, the film thickness was measured. A PGMEA solvent was dispensed on the film and allowed to stand for 30 seconds. The resultant was spin dried and baked at 100° C. for 60 seconds to evaporate the PGMEA. The film thickness was measured to find the film thicknesses before and after the PGMEA treatment. The film thickness after the film formation and the film thickness after the PGMEA treatment were used to determine a film remaining ratio. Table 6 shows lists of the results and the baking conditions.

TABLE 6

| | Organic film material | Film thickness after film formation: a (Å) | Film thickness after PGMEA treatment: b (Å) | b/a × 100 (%) | Baking condition |
|---|---|---|---|---|---|
| Example 3-1 | UDL-1 | 2008 | 2006 | 99.9 | 350° C. × 60 sec. |
| Example 3-2 | UDL-2 | 2003 | 1998 | 99.8 | 350° C. × 60 sec. |
| Example 3-3 | UDL-3 | 2013 | 2010 | 99.9 | 350° C. × 60 sec. |
| Example 3-4 | UDL-4 | 2013 | 2010 | 99.9 | 350° C. × 60 sec. |
| Example 3-5 | UDL-5 | 2001 | 2000 | 100.0 | 350° C. × 60 sec. |
| Example 3-6 | UDL-6 | 2008 | 2003 | 99.8 | 350° C. × 60 sec. |
| Example 3-7 | UDL-7 | 1998 | 1992 | 99.7 | 350° C. × 60 sec. |
| Example 3-8 | UDL-8 | 2007 | 2003 | 99.8 | 350° C. × 60 sec. |
| Example 3-9 | UDL-9 | 1994 | 1991 | 99.8 | 250° C. × 60 sec. |
| Example 3-10 | UDL-10 | 2015 | 2013 | 99.9 | 250° C. × 60 sec. |
| Example 3-11 | UDL-11 | 2002 | 1999 | 99.9 | 250° C. × 60 sec. |
| Example 3-12 | UDL-12 | 2005 | 2000 | 99.8 | 250° C. × 60 sec. |
| Example 3-13 | UDL-13 | 2002 | 1998 | 99.8 | 250° C. × 60 sec. |
| Example 3-14 | UDL-14 | 1994 | 1990 | 99.8 | 250° C. × 60 sec. |
| Example 3-15 | UDL-15 | 1990 | 1988 | 99.9 | 350° C. × 60 sec. |
| Example 3-16 | UDL-16 | 2013 | 2009 | 99.8 | 350° C. × 60 sec. |
| Comparative Example 3-1 | Comparative UDL-1 | poor film formation | | | 350° C. × 60 sec. |
| Comparative Example 3-2 | Comparative UDL-2 | poor film formation | | | 350° C. × 60 sec. |
| Comparative Example 3-3 | Comparative UDL-3 | poor film formation | | | 350° C. × 60 sec. |
| Comparative Example 3-4 | Comparative UDL-4 | 2002 | 1998 | 99.8 | 350° C. × 60 sec. |
| Comparative Example 3-5 | Comparative UDL-5 | 2004 | 2000 | 99.8 | 250° C. × 60 sec. |
| Comparative Example 3-6 | Comparative UDL-6 | 2008 | 2004 | 99.8 | 250° C. × 60 sec. |
| Comparative Example 3-7 | Comparative UDL-7 | 2015 | 2010 | 99.8 | 250° C. × 60 sec. |
| Comparative Example 3-8 | Comparative UDL-8 | 2001 | 1996 | 99.8 | 250° C. × 60 sec. |
| Comparative Example 3-9 | Comparative UDL-9 | 2003 | 1998 | 99.8 | 250° C. × 60 sec. |
| Comparative Example 3-10 | Comparative UDL-10 | 2012 | 2003 | 99.6 | 250° C. × 60 sec. |

As shown in Table 6, in Examples 3-1 to 3-16 using the inventive polymers, the film remaining ratios after the PGMEA treatment were 99% or more. This indicates that the crosslinking reaction took place by heating, and sufficient solvent resistance was exhibited. Examples 3-9 to 3-11 using the thermal acid generator verified that even under the condition where the baking temperature was lowered to 250° C., sufficient solvent resistance was exhibited by the self-curing reaction. Moreover, Examples 3-12 to 3-14 verified that solvent resistance was exhibited by the curing reaction with the polymers or compound having an aromatic ring as a partial structure. Incidentally, Comparative Example UDL-1 to -3 resulted in poor film formation on the silicon substrate as in the result of the coatability test in Example 2. Hence, it was impossible to evaluate the organic film property.

Example 4: Etching Test (Examples 4-1 to 4-16, Comparative Examples 4-1 to 4-7)

[Etching Test with $CF_4/CHF_3$-Based Gas]

UDL-1 to -16 and Comparative Example UDL-4 to -10 prepared above were each applied onto a silicon substrate and baked in the atmosphere under the baking conditions shown in Table 7 at 250° C. or 350° C. for 60 seconds to form an organic film having a film thickness of 200 nm. Then, an etching test was conducted with $CF_4/CHF_3$-based gas under the following conditions. In this case, a dry etching apparatus TE-8500 manufactured by Tokyo Electron Limited was used to find a film thickness difference of each polymer film before and after the etching. Table 7 shows the results.

The etching conditions were as follows:

| Chamber pressure | 40.0 Pa |
| RF power | 1,000 W |
| $CHF_3$ gas flow rate | 10 ml/min |
| $CF_4$ gas flow rate | 100 ml/min |
| He gas flow rate | 200 ml/min |
| Time | 20 sec |

Table 7 shows the film reduction ratio in each Example and Comparative Example, given that the film thickness of Comparative Example UDL-4 reduced by the etching with $CF_4/CHF_3$-based gas is taken as 100. It can be understood that the smaller the ratio, the more excellent the etching resistance.

[Etching Test with $O_2$-Based Gas]

In a manner similar to the above, UDL-1 to -16 and Comparative Example UDL-4 to -10 were each applied onto a silicon substrate and baked in the atmosphere at 350° C. for 60 seconds to form an organic film having a film thickness of 200 nm. An etching test was conducted with $O_2$-based gas under the following conditions. In this case, a dry etching apparatus TE-8500 manufactured by Tokyo Electron Limited was used to find a film thickness difference of each polymer film before and after the etching. Table 7 also shows these results.

The etching conditions were as follows:

| | |
|---|---|
| Chamber pressure | 40.0 Pa |
| RF power | 100 W |
| O₂ gas flow rate | 30 ml/min |
| N₂ gas flow rate | 70 ml/min |
| Time | 60 sec |

As in the case of the etching test with $CF_4/CHF_3$-based gas, Table 7 shows the film reduction ratio in each Example and Comparative Example, given that the film thickness of Comparative Example UDL-4 reduced by the etching with $O_2$-based gas is taken as 100. It can be understood that the smaller the ratio, the more excellent the etching resistance.

TABLE 7

| | Organic film material | Baking condition | Etching test with $CF_4/CHF_3$-based gas | | Etching Test with $O_2$-based gas | |
|---|---|---|---|---|---|---|
| | | | Film thickness reduction amount (Å) | Film reduction ratio with Comparative Example 4-1 taken as 100% | Film thickness reduction amount (Å) | Film reduction, ratio with Comparative Example 4-1 taken as 100% |
| Example 4-1 | UDL-1 | 350° C. × 60 sec. | 916 | 102.0% | 1295 | 102.0% |
| Example 4-2 | UDL-2 | 350° C. × 60 sec. | 893 | 99.4% | 1269 | 99.9% |
| Example 4-3 | UDL-3 | 350° C. × 60 sec. | 896 | 99.8% | 1271 | 100.1% |
| Example 4-4 | UDL-4 | 350° C. × 60 sec. | 902 | 100.5% | 1283 | 101.0% |
| Example 4-5 | UDL-5 | 350° C. × 60 sec. | 904 | 100.7% | 1280 | 100.8% |
| Example 4-6 | UDL-6 | 350° C. × 60 sec. | 896 | 99.8% | 1262 | 99.4% |
| Example 4-7 | UDL-7 | 350° C. × 60 sec. | 896 | 99.8% | 1261 | 99.3% |
| Example 4-8 | UDL-8 | 350° C. × 60 sec. | 899 | 100.1% | 1269 | 99.9% |
| Example 4-9 | UDL-9 | 350° C. × 60 sec. | 880 | 98.0% | 1246 | 98.1% |
| Example 4-10 | UDL-10 | 250° C. × 60 sec. | 878 | 97.8% | 1242 | 97.8% |
| Example 4-11 | UDL-11 | 250° C. × 60 sec. | 873 | 97.2% | 1236 | 97.3% |
| Example 4-12 | UDL-12 | 250° C. × 60 sec. | 920 | 102.4% | 1270 | 100.0% |
| Example 4-13 | UDL-12 | 250° C. × 60 sec. | 947 | 105.5% | 1334 | 105.0% |
| Example 4-14 | UDL-14 | 250° C. × 60 sec. | 960 | 106.9% | 1359 | 107.0% |
| Example 4-15 | UDL-15 | 350° C. × 60 sec. | 905 | 100.8% | 1279 | 100.7% |
| Example 4-16 | UDL-16 | 350° C. × 60 sec. | 900 | 100.2% | 1271 | 100.1% |
| Comparative Example 4-1 | Comparative Example UDL-4 | 350° C. × 60 sec. | 898 | 100.0% | 1270 | 100.0% |
| Comparative Example 4-2 | Comparative Example UDL-5 | 250° C. × 60 sec. | 924 | 102.9% | 1294 | 101.9% |
| Comparative Example 4-3 | Comparative Example UDL-6 | 250° C. × 60 sec. | 348 | 105.6% | 1328 | 104.6% |
| Comparative Example 4-4 | Comparative Example UDL-7 | 250° C. × 60 sec. | 958 | 106.7% | 1359 | 107.0% |
| Comparative Example 4-5 | Comparative Example UDL-8 | 250° C. × 60 sec. | 1031 | 114.8% | 1453 | 114.4% |
| Comparative Example 4-6 | Comparative Example UDL-9 | 250° C. × 60 sec. | 1052 | 117.1% | 1483 | 116.8% |
| Comparative Example 4-7 | Comparative Example UDL-10 | 250° C. × 60 sec. | 1070 | 119.2% | 1505 | 118.5% |

As shown in Table 7, in comparison between Examples 4-1 to 4-11, 4-15, 4-16 and Comparative Example 4-1, any result exhibited almost equivalent etching resistance. It was verified that the self-curing reaction of the inventive polymers favorably proceeded without etching resistance degradation due to, for example, remaining of the leaving group moieties. Moreover, the comparison between Examples 4-2, 4-4, 4-8 and Examples 4-9 to 4-11 in which the thermal acid generator was added revealed that the curing reaction efficiently proceeded by action of the thermal acid generator to form fine films, so that the etching resistance was improved. Further, in comparison between Examples 4-12 to 4-14 using the inventive polymers together with the compound or polymer having an aromatic ring in combination as a cross-linking agent and Comparative Examples 4-5 to 4-7 using the polynuclear phenol-based crosslinking agent, Examples 4-12 to 4-14 using the inventive polymers enhanced the etching resistance, revealing that the inventive polymers effectively function as a crosslinking agent. These results also verified that the use of the inventive polymers makes it possible to form a fine cured film with high carbon density and form an organic film excellent in etching resistance.

Example 5: Filling Property Evaluation (Examples 5-1 to 5-16, Comparative Examples 5-1 to 5-4)

On a stepped $SiO_2$ substrate which was a Si substrate having a dense hole pattern with each thickness of 500 nm and each diameter of 160 nm formed therein, a resist underlayer film was formed by applying one of UDL-1 to -16 and Comparative Example UDL-4 to -7 under such conditions that the film with a thickness of 200 nm was formed on a flat portion of the substrate by baking at 250° C. or 350° C. for 60 seconds. Each substrate having such a resist underlayer film formed thereon was split and observed with a scanning electron microscope (SEM) to check whether the holes were filled to the bottoms with the resist underlayer film. Table 8 shows the results.

TABLE 8

| | Resist underlayer film | Filling property | Baking condition |
|---|---|---|---|
| Example 5-1 | UDL-1 | holes were favorably filled to bottoms | 350° C. × 60 sec. |
| Example 5-2 | UDL-2 | holes were favorably filled to bottoms | 350° C. × 60 sec. |
| Example 5-3 | UDL-3 | holes were favorably filled to bottoms | 350° C. × 60 sec. |
| Example 5-4 | UDL-4 | holes were favorably filled to bottoms | 350° C. × 60 sec. |
| Example 5-5 | UDL-5 | holes were favorably filled to bottoms | 350° C. × 60 sec. |
| Example 5-6 | UDL-6 | holes were favorably filled to bottoms | 350° C. × 60 sec. |
| Example 5-7 | UDL-7 | holes were favorably filled to bottoms | 350° C. × 60 sec. |
| Example 5-8 | UDL-8 | holes were favorably filled to bottoms | 350° C. × 60 sec. |
| Example 5-9 | UDL-9 | holes were favorably filled to bottoms | 250° C. × 60 sec. |
| Example 5-10 | UDL-10 | holes were favorably filled to bottoms | 250° C. × 60 sec. |
| Example 5-11 | UDL-11 | holes were favorably filled to bottoms | 250° C. × 60 sec. |
| Example 5-12 | UDL-12 | holes were favorably filled to bottoms | 250° C. × 60 sec. |
| Example 5-13 | UDL-13 | holes were favorably filled to bottoms | 250° C. × 60 sec. |
| Example 5-14 | UDL-14 | holes were favorably filled to bottoms | 250° C. × 60 sec. |
| Example 5-15 | UDL-15 | holes were favorably filled to bottoms | 350° C. × 60 sec. |
| Example 5-16 | UDL-16 | holes were favorably filled to bottoms | 350° C. × 60 sec. |
| Comparative Example 5-1 | Comparative Example UDL-4 | holes were favorably filled to bottoms | 350° C. × 60 sec. |
| Comparative Example 5-2 | Comparative Example UDL-5 | voids were formed | 250° C. × 60 sec. |
| Comparative Example 5-3 | Comparative Example UDL-6 | voids were formed | 250° C. × 60 sec. |
| Comparative Example 5-4 | Comparative Example UDL-7 | voids were formed | 250° C. × 60 sec. |

As shown in Table 8, in all of Examples 5-1 to 5-16 in which the resist underlayer films were formed by using UDL-1 to UDL-16 of the present invention, the holes were favorably filled to the bottoms. This indicates that even when a substrate to be processed has a step(s), sufficient filling property can be expected, and the inventive materials have useful properties as a resist underlayer film material for multilayer processes. In Comparative Examples 5-2 to 5-4 using the highly crystalline single-molecular compounds as a crosslinking agent, the thermal flowability was impaired, sufficient filling property was not guaranteed, and voids were formed. In contrast, Examples 5-12 to 5-14 using the inventive polymers as a crosslinking agent exhibited favorable filling property. This suggests that thermal flowability is imparted by using the inventive polymers and the filling property is effectively improved, too.

Example 6: Pattern Etching Test (Examples 6-1 to 6-16, Comparative Examples 6-1 to 6-7)

UDL-1 to -16 and Comparative UDL-4 to -10 prepared above were each applied onto a Si wafer substrate having a diameter of 300 mm on which a $SiO_2$ film with a film thickness of 200 nm had been formed. Then, a resist underlayer film was formed to have a film thickness of 200 nm after baking in the atmosphere at 350° C. for 60 seconds. A silicon-containing resist underlayer film material (SOG-1) was applied thereon and baked at 220° C. for 60 seconds to form a resist underlayer film having a film thickness of 35 nm. A resist upper layer film material (SL resist for ArF) was applied thereon and baked at 105° C. for 60 seconds to form a resist upper layer film having a film thickness of 100 nm. A liquid immersion top coat material (TC-1) was applied onto the resist upper layer film and baked at 90° C. for 60 seconds to form a top coat having a film thickness of 50 nm.

The resist upper layer film material (SL resist for ArF) was prepared by: dissolving a polymer (RP1), an acid generator (PAG1), and a basic compound (Amine1) in a solvent containing 0.1 mass % FC-430 (manufactured by Sumitomo 3M Ltd.) in proportions shown in Table 9; and filtering the solution through a 0.1-μm filter made of a fluorinated resin.

TABLE 9

| | Polymer (parts by mass) | Acid generator (parts by mass) | Basic compound (parts by mass) | Solvent (parts by mass) |
|---|---|---|---|---|
| SL resist for ArF | RP1 (100) | PAG1 (6.6) | Amine1 (0.8) | PGMEA (2500) |

The structural formulae of the polymer (RP1), acid generator (PAG1), and basic compound (Amine1) thus used are shown below.

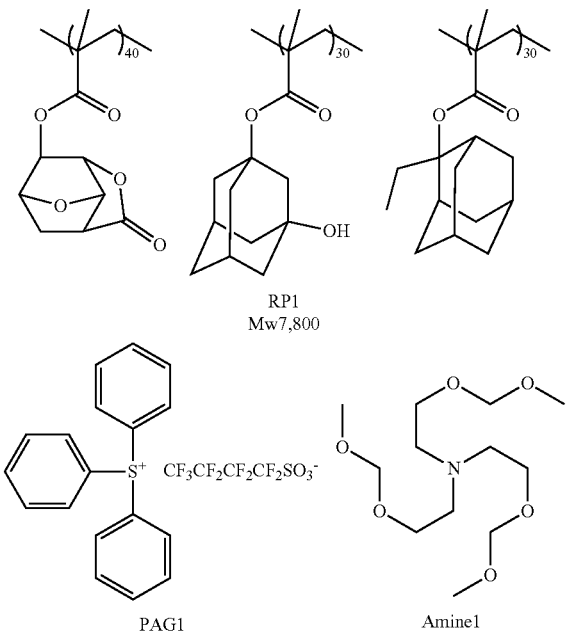

PAG1  Amine1

The liquid immersion top coat material (TC-1) was prepared by: dissolving a top coat polymer (PP1) in organic solvents in proportions shown in Table 10; and filtering the solution through a 0.1-μm filter made of a fluorinated resin.

TABLE 10

|  | Polymer (parts by mass) | Organic solvent (parts by mass) |
|---|---|---|
| TC-1 | PP1 (100) | diisoamyl ether (2700) 2-methyl-1-butanol (270) |

The structural formula of the polymer (PP1) thus used is shown below.

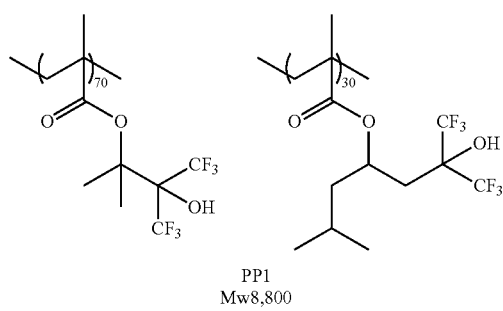

PP1
Mw8,800

The silicon-containing resist underlayer film material (SOG-1) serving as a silicon-containing resist middle layer material (SOG-1) was prepared by: dissolving a polymer represented by an ArF silicon-containing underlayer film polymer (SiP1) and a crosslinking catalyst (CAT1) in an organic solvent containing 0.1 mass % FC-4430 (manufactured by Sumitomo 3M Ltd.) in proportions shown in Table 11; and filtering the solution through a filter having a pore size of 0.1 μm and made of a fluorinated resin.

TABLE 11

|  | Polymer (parts by mass) | Thermal crosslinking catalyst (parts by mass) | Organic solvent (parts by mass) |
|---|---|---|---|
| SOG-1 | SiP1 (100) | CAT1 (1) | propylene glycol monomethyl ether (4000) |

The structural formulae of the ArF silicon-containing underlayer film polymer (SiP1) and crosslinking catalyst (CAT1) thus used are shown below.

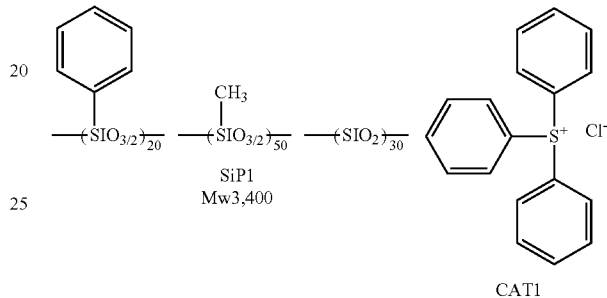

Next, exposure was carried out at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), followed by baking at 100° C. for 60 seconds (PEB), and development with a 2.38 mass % tetramethylammonium hydroxide (TMAH) aqueous solution for 30 seconds. Thus, a positive line and space pattern was obtained with the resist line width ranging from 50 nm to 30 nm at a pitch of 100 nm.

Then, dry-etching processing with an etching apparatus Telius manufactured by Tokyo Electron Limited was performed successively as follows. The silicon-containing middle layer was processed using the resist pattern as a mask; the underlayer film was processed using the silicon-containing middle layer as a mask; and the SiO$_2$ film was processed using the underlayer film as a mask.

The etching conditions were as follows.
Conditions for transferring the resist pattern to the SOG film:

| Chamber pressure | 10.0 Pa |
|---|---|
| RF power | 1,500 W |
| CF$_4$ gas flow rate | 15 sccm |
| O$_2$ gas flow rate | 75 sccm |
| Time | 15 sec |

Transferring conditions from the SOG film to the underlayer film:

| Chamber pressure | 2.0 Pa |
|---|---|
| RF power | 500 W |
| Ar gas flow rate | 75 sccm |
| O$_2$ gas flow rate | 45 sccm |
| Time | 120 sec |

Transferring conditions to the SiO₂ film:

| | |
|---|---|
| Chamber pressure | 2.0 Pa |
| RF power | 2,200 W |
| C₅F₁₂ gas flow rate | 20 sccm |
| C₂F₆ gas flow rate | 10 sccm |
| Ar gas flow rate | 300 sccm |
| O₂ gas flow rate | 60 sccm |
| Time | 90 sec |

The pattern cross sections were observed with an electron microscope (S-4700) manufactured by Hitachi, Ltd. The profiles were compared and summarized in Table 12.

TABLE 12

| | Resist underlayer film material | Baking condition | Pattern profile after development | Profile after etching for transferring to middle layer | Profile after etching for transferring to underlayer film | Profile after etching for transferring to substrate | Minimum dimension (nm) without pattern twisting after etching for transferring to substrate |
|---|---|---|---|---|---|---|---|
| Example 6-1 | UDL-1 | 350° C. × 60 sec. | vertical profile | vertical profile | vertical profile | vertical profile | 33 |
| Example 6-2 | UDL-2 | 350° C. × 60 sec. | vertical profile | vertical profile | vertical profile | vertical profile | 31 |
| Example 6-3 | UDL-3 | 350° C. × 60 sec. | vertical profile | vertical profile | vertical profile | vertical profile | 31 |
| Example 6-4 | UDL-4 | 350° C. × 60 sec. | vertical profile | vertical profile | vertical profile | vertical profile | 30 |
| Example 6-5 | UDL-5 | 350° C. × 60 sec. | vertical profile | vertical profile | vertical profile | vertical profile | 30 |
| Example 6-6 | UDL-6 | 350° C. × 60 sec. | vertical profile | vertical profile | vertical profile | vertical profile | 31 |
| Example 6-7 | UDL-7 | 350° C. × 60 sec. | vertical profile | vertical profile | vertical proflie | vertical profile | 31 |
| Example 6-8 | UDL-8 | 350° C. × 60 sec. | vertical profile | vertical profile | vertical profile | vertical profile | 30 |
| Example 6-9 | UDL-9 | 250° C. × 60 sec. | vertical profile | vertical profile | vertical profile | vertical profile | 29 |
| Example 6-10 | UDL-10 | 250° C. × 60 sec. | vertical profile | vertical profile | vertical profile | vertical profile | 28 |
| Example 6-11 | UDL-11 | 250° C. × 60 sec. | vertical profile | vertical profile | vertical profile | vertical profile | 28 |
| Example 6-12 | UDL-12 | 250° C. × 60 sec. | vertical profile | vertical profile | vertical profile | vertical profile | 31 |
| Example 6-13 | UDL-13 | 250° C. × 60 sec. | vertical profile | vertical profile | vertical profile | vertical profile | 35 |
| Example 6-14 | UDL-14 | 250° C. × 60 sec. | vertical profile | vertical profile | vertical profile | vertical profile | 37 |
| Example 6-15 | UDL-15 | 350° C. × 60 sec. | vertical profile | vertical profile | vertical profile | vertical profile | 31 |
| Example 6-16 | UDL-16 | 350° C. × 60 sec. | vertical profile | vertical profile | vertical profile | vertical profile | 30 |
| Comparative Example 6-1 | Comparative Example UDL-4 | 350° C. × 60 sec. | vertical profile | vertical profile | vertical profile | vertical profile | 31 |
| Comparative Example 6-2 | Comparative Example UDL-5 | 250° C. × 60 sec. | vertical profile | vertical profile | vertical profile | processing failure | 32 |
| Comparative Example 6-3 | Comparative Example UDL-6 | 250° C. × 60 sec. | vertical profile | vertical profile | vertical profile | processing failure | 34 |
| Comparative Example 6-4 | Comparative Example UDL-7 | 250° C. × 60 sec. | vertical profile | vertical profile | vertical profile | processing failure | 35 |
| Comparative Example 6-5 | Comparative Example UDL-9 | 250° C. × 60 sec. | vertical profile | vertical profile | vertical profile | processing failure | 38 |
| Comparative Example 6-6 | Comparative Example UDL-9 | 250° C. × 60 sec. | vertical profile | vertical profile | vertical profile | processing failure | 40 |
| Comparative Example 6-7 | Comparative Example UDL-10 | 250° C. × 60 sec. | vertical profile | vertical profile | vertical profile | processing failure | 42 |

As shown in Table 12, the results of Examples 6-1 to 6-16 revealed that when UDL-1 to -16 were used as organic films of the three-layer resists for immersion lithography, the resist profiles after the development were favorable in the pattern profile evaluation. This indicates useful effect as an antireflective film.

Regarding the pattern profiles after the etching in Examples 6-1 to 6-16, the resist profiles after the development and the profiles of the organic films after oxygen etching and subsequent substrate-processing etching were all favorable. The comparison between Examples 6-2, 6-4, 6-8 and Examples 6-9 to 6-11 in which the acid generator was added showed that adding the acid generator further promoted the crosslinking reaction, and finer films were formed; thus, no twisting occur even when the line width was narrower. The comparison between Examples 6-12, 6-13, 6-14 and Comparative Examples 6-2, 6-3, 6-4 showed that the use of the inventive polymers as a crosslinking agent improves twisting resistance by 5 nm or more, and that the inventive polymers are useful as crosslinking agents. These results suggest that the use of the inventive polymers makes it possible to form a fine and high-strength organic film having high carbon density.

Example 7: Patterning Test (Examples 7-1 to 7-16, Comparative Examples 7-1 to 7-4)

The organic film materials (UDL-1 to -16, Comparative UDL-4 to -7) were each applied onto a SiO$_2$ substrate having an HMDS-treated trench pattern (trench width: 10 µm, trench depth: 0.10 µm). Then, coating films were formed in the atmosphere, and subjected to patterning and dry etching under the same conditions as in Example 6. The resulting pattern profiles were observed. Table 13 shows the results.

TABLE 13

| Organic film material | Pattern profile after etching for transferring to substrate | Baking condition |
|---|---|---|
| Example 7-1 | UDL-1 | vertical profile | 350° C. × 60 sec. |
| Example 7-2 | UDL-2 | vertical profile | 350° C. × 60 sec. |
| Example 7-3 | UDL-3 | vertical profile | 350° C. × 60 sec. |
| Example 7-4 | UDL-4 | vertical profile | 350° C. × 60 sec. |
| Example 7-5 | UDL-5 | vertical profile | 350° C. × 60 sec. |
| Example 7-6 | UDL-6 | vertical profile | 350° C. × 60 sec. |
| Example 7-7 | UDL-7 | vertical profile | 350° C. × 60 sec. |
| Example 7-8 | UDL-8 | vertical profile | 350° C. × 60 sec. |
| Example 7-9 | UDL-9 | vertical profile | 250° C. × 60 sec. |
| Example 7-10 | UDL-10 | vertical profile | 250° C. × 60 sec. |
| Example 7-11 | UDL-11 | vertical profile | 250° C. × 60 sec. |
| Example 7-12 | UDL-12 | vertical profile | 250° C. × 60 sec. |
| Example 7-13 | UDL-13 | vertical profile | 250° C. × 60 sec. |
| Example 7-14 | UDL-14 | vertical profile | 250° C. × 60 sec. |
| Example 7-15 | UDL-15 | vertical profile | 350° C. × 60 sec. |
| Example 7-16 | UDL-16 | vertical profile | 350° C. × 60 sec. |
| Comparative Example 7-1 | Comparative UDL-4 | No pattern due to poor film formation on substrate | 350° C. × 60 sec. |
| Comparative Example 7-2 | Comparative UDL-5 | pattern collapse | 250° C. × 60 sec. |
| Comparative Example 7-3 | Comparative UDL-6 | pattern collapse | 250° C. × 60 sec. |
| Comparative Example 7-4 | Comparative UDL-7 | pattern collapse | 250° C. × 60 sec. |

As shown in Table 13 and the results of the inventive materials (Examples 7-1 to 7-16) for forming an organic film, all the resist upper layer film patterns were favorably transferred to the final substrates. This verified that the inventive materials for forming an organic film are suitably used in fine patterning according to the multilayer resist method. Meanwhile, in Comparative Example 7-1, the pattern formation was possible on a flat substrate that had no complicated shape as in Example 6, but it was impossible to form a film on the HMDS-treated pattern substrate as in Example 7, and to form the pattern, either. In Comparative Examples 7-2 to 7-4 also, pattern collapse occurred during the pattern processing due to the insufficient filling property as shown by the result of Example 5, and it was impossible to form the pattern.

Example 8: Planarizing Property Evaluation (Examples 8-1 to 8-4, Comparative Example 8-1)

The organic film materials (UDL-5, -8, -15, -16, Comparative UDL-4) were each applied onto a SiO$_2$ wafer substrate having a giant isolated trench pattern (trench width: 10 µm, trench depth: 0.10 µm), and baked in the atmosphere at 350° C. for 60 seconds. Then, a step (delta in FIG. 2) between the trench portion and the non-trench portion of the resulting organic film was observed with an atomic force microscope (AFM) NX10 manufactured by Park systems Corp. Table 14 shows the result. In this evaluation, the smaller the step, the more favorable the planarizing property. Note that, in this evaluation, a trench pattern having a depth of 0.10 µm was generally planarized using an organic film material with a film thickness of approximately 0.2 µm. This is a strict evaluation condition to evaluate the planarizing property.

TABLE 14

| | Organic film material | Step (nm) |
|---|---|---|
| Example 8-1 | UDL-5 | 45 |
| Example 8-2 | UDL-8 | 40 |
| Example 8-3 | UDL-15 | 30 |
| Example 8-4 | UDL-16 | 30 |
| Comparative Example 8-1 | Comparative UDL-4 | 55 |

As shown in Table 14, the organic films obtained from the inventive materials for forming an organic film had smaller steps between the trench and non-trench portions than that in Comparative Example 8-1. This verified that the inventive materials are excellent in planarizing property. In comparison between Example 8-2 using the inventive polymer and Comparative Example 8-1 using the single-molecular compound, the use of the inventive polymer resulted in more excellent planarizing property. This suggests that the flexible chain with the ether bonds of the inventive polymer enhances the thermal flowability. Moreover, the comparison between Examples 8-3, 8-4 in which the high-boiling-point solvent was added and Examples 8-1, 8-2 without the high-boiling-point solvent shows that adding the high-boiling-point solvent improved the planarizing property.

From the above, the inventive material for forming an organic film is excellent in film formability, enables high etching resistance and excellent twisting resistance during etching, and is capable of pattern formation regardless of the shape and material of a substrate that is a body to be processed. Moreover, since the filling and planarizing properties are also excellent, the inventive material is quite useful as an underlayer film for multilayer resist processes, particularly a three-layer resist process, for ultrafine and highly precise patterning.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A material for forming an organic film, comprising:
a polymer having a repeating unit shown by the following general formula (1); and
an organic solvent,

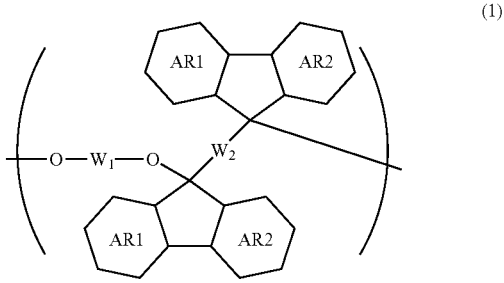

wherein AR1 and AR2 each represent a benzene ring or a naphthalene ring which optionally have a substituent; $W_1$ represents a divalent organic group having 2 to 20 carbon atoms and no aromatic ring, and a methylene group constituting the organic group is optionally substituted with an oxygen atom or a carbonyl group; and $W_2$ represents a divalent organic group having 6 to 80 carbon atoms and at least one or more aromatic rings.

2. The material for forming an organic film according to claim 1, wherein the divalent organic group represented by $W_2$ in the general formula (1) is any of the following,

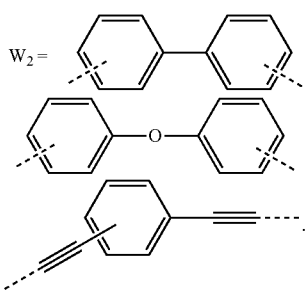

3. The material for forming an organic film according to claim 1, wherein the polymer has a weight-average molecular weight of 500 to 5000.

4. The material for forming an organic film according to claim 2, wherein the polymer has a weight-average molecular weight of 500 to 5000.

5. The material for forming an organic film according to claim 1, further comprising an acid generator.

6. The material for forming an organic film according to claim 2, further comprising an acid generator.

7. The material for forming an organic film according to claim 1, further comprising at least one of a surfactant, a plasticizer, and a compound having an aromatic ring as a partial structure other than the polymer.

8. The material for forming an organic film according to claim 2, further comprising at least one of a surfactant, a plasticizer, and a compound having an aromatic ring as a partial structure other than the polymer.

9. A patterning process comprising:
forming an organic film by using the material for forming an organic film according to claim 1 on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching using the resist upper layer film having the formed pattern as a mask;
transferring the pattern to the organic film by etching using the silicon-containing resist underlayer film having the transferred pattern as a mask; and
further forming the pattern in the body to be processed by etching using the organic film having the transferred pattern as a mask.

10. A patterning process comprising:
forming an organic film by using the material for forming an organic film according to claim 1 on a body to be processed;
forming a silicon-containing resist underlayer film by using a silicon-containing resist underlayer film material on the organic film;
forming an organic antireflective film on the silicon-containing resist underlayer film;
forming a resist upper layer film by using a photoresist composition on the organic antireflective film, so that a 4-layered film structure is constructed,
forming a circuit pattern in the resist upper layer film;
transferring the pattern to the organic antireflective film and the silicon-containing resist underlayer film by etching using the resist upper layer film having the formed pattern as a mask;
transferring the pattern to the organic film by etching using the silicon-containing resist underlayer film having the transferred pattern as a mask; and
further forming the pattern in the body to be processed by etching using the organic film having the transferred pattern as a mask.

11. A patterning process comprising:
forming an organic film by using the material for forming an organic film according to claim 1 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching using the resist upper layer film having the formed pattern as a mask;
transferring the pattern to the organic film by etching using the inorganic hard mask having the transferred pattern as a mask; and
further forming the pattern in the body to be processed by etching using the organic film having the transferred pattern as a mask.

12. A patterning process comprising:
  forming an organic film by using the material for forming an organic film according to claim 1 on a body to be processed;
  forming an inorganic hard mask selected from a silicon oxide film, a silicon nitride film, and a silicon oxynitride film on the organic film;
  forming an organic antireflective film on the inorganic hard mask;
  forming a resist upper layer film by using a photoresist composition on the organic antireflective film, so that a 4-layered film structure is constructed;
  forming a circuit pattern in the resist upper layer film;
  transferring the pattern to the organic antireflective film and the inorganic hard mask by etching using the resist upper layer film having the formed pattern as a mask;
  transferring the pattern to the organic film by etching using the inorganic hard mask having the transferred pattern as a mask; and
  further forming the pattern in the body to be processed by etching using the organic film having the transferred pattern as a mask.

13. The patterning process according to claim 11, wherein the inorganic hard mask is formed by a CVD method or an ALD method.

14. The patterning process according to claim 12, wherein the inorganic hard mask is formed by a CVD method or an ALD method.

15. The patterning process according to claim 9, wherein the pattern is formed in the resist upper layer film by employing a method of a photolithography with a wavelength of 10 nm or more and 300 nm or less, direct drawing with electron beam, nanoimprinting, or a combination thereof.

16. The patterning process according to claim 9, wherein alkali development or organic solvent development is employed as a development method in the patterning process.

17. The patterning process according to claim 9, wherein the body to be processed is a semiconductor device substrate, a metal film, a metal carbide film, a metal oxide film, a metal nitride film, a metal oxycarbide film, or a metal oxynitride film.

18. The patterning process according to claim 17, wherein the metal is silicon, titanium, tungsten, hafnium, zirconium, chromium, germanium, cobalt, copper, silver, gold, aluminum, indium, gallium, arsenic, palladium, iron, tantalum, iridium, molybdenum, ruthenium, or an alloy thereof.

19. A polymer comprising a repeating unit shown by the following general formula (1),

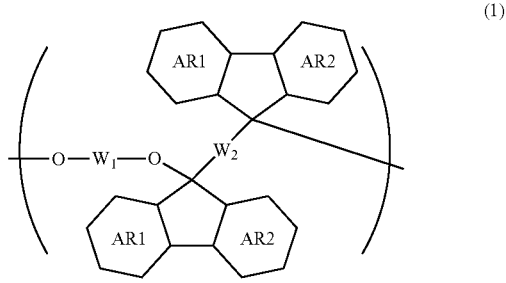

wherein AR1 and AR2 each represent a benzene ring or a naphthalene ring which optionally have a substituent; $W_1$ represents a divalent organic group having 2 to 20 carbon atoms and no aromatic ring, and a methylene group constituting the organic group is optionally substituted with an oxygen atom or a carbonyl group; and $W_2$ represents a divalent organic group having 6 to 80 carbon atoms and at least one or more aromatic rings.

20. The polymer according to claim 19, wherein the divalent organic group represented by $W_2$ in the general formula (1) is any of the following,

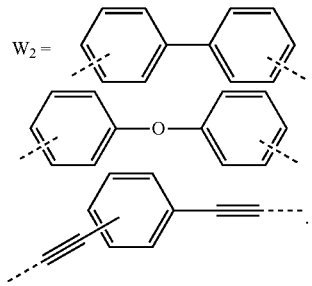

* * * * *